(12) United States Patent
Kwon et al.

(10) Patent No.: US 11,282,851 B2
(45) Date of Patent: Mar. 22, 2022

(54) VERTICAL CAPACITOR STRUCTURE AND NON-VOLATILE MEMORY DEVICE INCLUDING THE SAME

(71) Applicant: Samsung Electronics Co., Ltd., Suwon-si (KR)

(72) Inventors: Taehong Kwon, Seoul (KR); Chanho Kim, Seoul (KR); Daeseok Byeon, Seongnam-si (KR); Pansuk Kwak, Seoul (KR); Chiweon Yoon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 89 days.

(21) Appl. No.: 16/662,073

(22) Filed: Oct. 24, 2019

(65) Prior Publication Data
US 2020/0321349 A1 Oct. 8, 2020

(30) Foreign Application Priority Data
Apr. 2, 2019 (KR) .................. 10-2019-0038603

(51) Int. Cl.
*H01L 27/11573* (2017.01)
*H01L 23/522* (2006.01)
(Continued)

(52) U.S. Cl.
CPC .. *H01L 27/11573* (2013.01); *H01L 27/11582* (2013.01); *H01L 29/7834* (2013.01); *H01L 29/94* (2013.01)

(58) Field of Classification Search
CPC ........... H01L 27/11573; H01L 27/1157; H01L 29/7834; H01L 29/94; H01L 23/5223;
(Continued)

(56) References Cited

U.S. PATENT DOCUMENTS 8,749,022 B2 * 6/2014 Chang .................. H01L 28/86
257/532
9,153,642 B2 10/2015 Li et al.
(Continued)

FOREIGN PATENT DOCUMENTS

KR 10-2015-0126216 11/2015

*Primary Examiner* — Shahed Ahmed
*Assistant Examiner* — Khatib A Rahman
(74) *Attorney, Agent, or Firm* — Muir Patent Law, PLLC

(57) ABSTRACT

A non-volatile memory device includes a substrate, a memory cell string including a vertical channel structure and memory cells, a voltage generator including a first transistor and configured to provide various voltages to the memory cells, and a vertical capacitor structure. The vertical capacitor structure includes first and second active patterns apart from each other in a first horizontal direction, a first gate pattern located above a channel region between the first and second active patterns, a first gate insulating film between the first gate pattern and the substrate in a vertical direction, and capacitor electrodes each extending in the vertical direction. The first transistor includes a second gate pattern and a second gate insulating film between the second gate pattern and the substrate in the vertical direction. The first gate insulating film has a thickness greater than a thickness of the second gate insulating film in the vertical direction.

18 Claims, 15 Drawing Sheets

(51) Int. Cl.
    *H01L 27/1157*        (2017.01)
    *H01L 29/78*          (2006.01)
    *H01L 29/94*          (2006.01)
    *H01L 27/11582*       (2017.01)

(58) Field of Classification Search
    CPC .............. H01L 23/485; H01L 27/0629; H01L 27/11575; H01L 27/11582; H01L 28/90; H01L 29/7833
    See application file for complete search history.

(56) References Cited

U.S. PATENT DOCUMENTS

| | | | |
|---|---|---|---|
| 9,548,085 B2* | 1/2017 | Saitoh | H01L 27/249 |
| 9,659,954 B2 | 5/2017 | Kim et al. | |
| 9,691,841 B2 | 6/2017 | Oh et al. | |
| 10,068,913 B2 | 9/2018 | Son et al. | |
| 10,446,570 B2* | 10/2019 | Lee | G11C 16/08 |
| 2010/0072560 A1* | 3/2010 | Lee | H01L 21/26586 |
| | | | 257/393 |
| 2011/0018096 A1 | 1/2011 | Izumi et al. | |
| 2012/0032243 A1* | 2/2012 | Kutsukake | H01L 27/11526 |
| | | | 257/298 |
| 2015/0137201 A1 | 5/2015 | Lee et al. | |
| 2015/0145015 A1* | 5/2015 | Shin | H01L 27/11531 |
| | | | 257/314 |
| 2015/0318296 A1* | 11/2015 | Kim | H01L 27/11556 |
| | | | 257/296 |
| 2019/0348119 A1* | 11/2019 | Bo | G11C 16/0441 |
| 2020/0373313 A1* | 11/2020 | Tsukamoto | G11C 11/221 |

* cited by examiner

VERTICAL CAPACITOR STRUCTURE AND NON-VOLATILE MEMORY DEVICE INCLUDING THE SAME

CROSS-REFERENCE TO RELATED APPLICATION

This application claims the benefit of Korean Patent Application No. 10-2019-0038603, filed on Apr. 2, 2019, in the Korean Intellectual Property Office, the disclosure of which is incorporated herein in its entirety by reference.

BACKGROUND

The inventive concept relates to a memory device, and more particularly, to a vertical capacitor structure and a non-volatile memory device including the same.

A memory device (e.g., an integrated circuit or semiconductor chip) is used to store data and is classified into a volatile memory device and a non-volatile memory device. As an example of a non-volatile memory device, a flash memory device may be used in a mobile phone, a digital camera, a mobile computer device, a stationary computer device, and other devices. Recently, as information communication devices have become multifunctional, there has been a demand for a large capacity and high-density integration of memory devices. Accordingly, a 3 dimensional (3D) non-volatile memory device including a plurality of word lines stacked on a substrate in a vertical direction is proposed. As the number of word lines stacked on the substrate in the 3D non-volatile memory device increases, it is required to increase the capacity of a charge pump included in a peripheral circuit area.

SUMMARY

The inventive concept provides a vertical capacitor structure for increasing a capacitance per unit area by improving an integration degree of a capacitor and a non-volatile memory device including the vertical capacitor structure.

According to an aspect of the inventive concept, there is provided a non-volatile memory device including: a substrate including a memory cell area and a peripheral circuit area, a memory cell string including a vertical channel structure and a plurality of memory cells located in the memory cell area, a voltage generator located in the peripheral circuit area, the voltage generator including a first transistor and configured to provide various voltages to the plurality of memory cells, and a vertical capacitor structure located in the peripheral circuit area. The vertical capacitor structure includes a first active pattern and a second active pattern apart from each other in a first horizontal direction, a first gate pattern above a channel region between the first active pattern and the second active pattern, a first gate insulating film between the first gate pattern and the substrate in a vertical direction with respect to the substrate, and a plurality of capacitor electrodes each extending in the vertical direction, wherein the plurality of capacitor electrodes include a first capacitor electrode in contact with the first gate pattern, to which a first voltage is applied, and forming a channel capacitor with the channel region, a second capacitor electrode in contact with the first active pattern and to which a second voltage is applied, the second voltage being different from the first voltage, and a third capacitor electrode in contact with the second active pattern and to which the second voltage is applied. The first transistor includes a second gate pattern and a second gate insulating film between the second gate pattern and the substrate in the vertical direction. The first gate insulating film has a thickness greater than a thickness of the second gate insulating film in the vertical direction.

According to another aspect of the inventive concept, there is provided a non-volatile memory device including: a first semiconductor layer, and a second semiconductor layer above the first semiconductor layer in a vertical direction and including a memory cell array having a plurality of memory cells stacked each other, wherein the first semiconductor layer includes a substrate, a first active pattern and a second active pattern arranged apart from each other in the substrate in a first horizontal direction, a first gate pattern above a channel region between the first active pattern and the second active pattern, and a plurality of capacitor electrodes each extending in the vertical direction, and the plurality of capacitor electrodes include a first capacitor electrode in contact with the first gate pattern, to which a first voltage is applied, and forming a channel capacitor with the channel region, a second capacitor electrode in contact with the first active pattern and to which a second voltage is applied, the second voltage being different from the first voltage, and a third capacitor electrode in contact with the second active pattern and to which the second voltage is applied.

According to another aspect of the inventive concept, there is provided a non-volatile memory device including: a substrate, a plurality of memory cells stacked each other on the substrate, a voltage generator including a low-voltage transistor and a high-voltage transistor on the substrate and configured to provide various voltages to the plurality of memory cells, and a vertical capacitor structure. The vertical capacitor structure includes a first active pattern and a second active pattern arranged apart from each other in the substrate in a first horizontal direction, a first gate pattern above of the substrate between the first active pattern and the second active pattern, a first gate insulating film between the first gate pattern and the substrate in a vertical direction with respect to the substrate, and a plurality of capacitor electrodes each extending in the vertical direction, wherein the plurality of capacitor electrodes include a first capacitor electrode in contact with the first gate pattern, to which a first voltage is applied, and forming a channel capacitor with the substrate, a second capacitor electrode in contact with the first active pattern, to which a second voltage is applied, the second voltage being different from the first voltage, and forming a first vertical capacitor with the first capacitor electrode, and a third capacitor electrode in contact with the second active pattern, to which the second voltage is applied, and forming a second vertical capacitor with the first capacitor electrode. The low-voltage transistor includes a second gate pattern and a second gate insulating film between the second gate pattern and the substrate in the vertical direction. The high-voltage transistor includes a third gate pattern and a third gate insulating film between the third gate pattern and the substrate in the vertical direction. The first gate insulating film has a thickness either greater than a thickness of the second gate insulating film or equal to a thickness of the third gate insulating film in the vertical direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, the inventive concept will now be described more fully with reference to the accompanying drawings.

Figure 1:
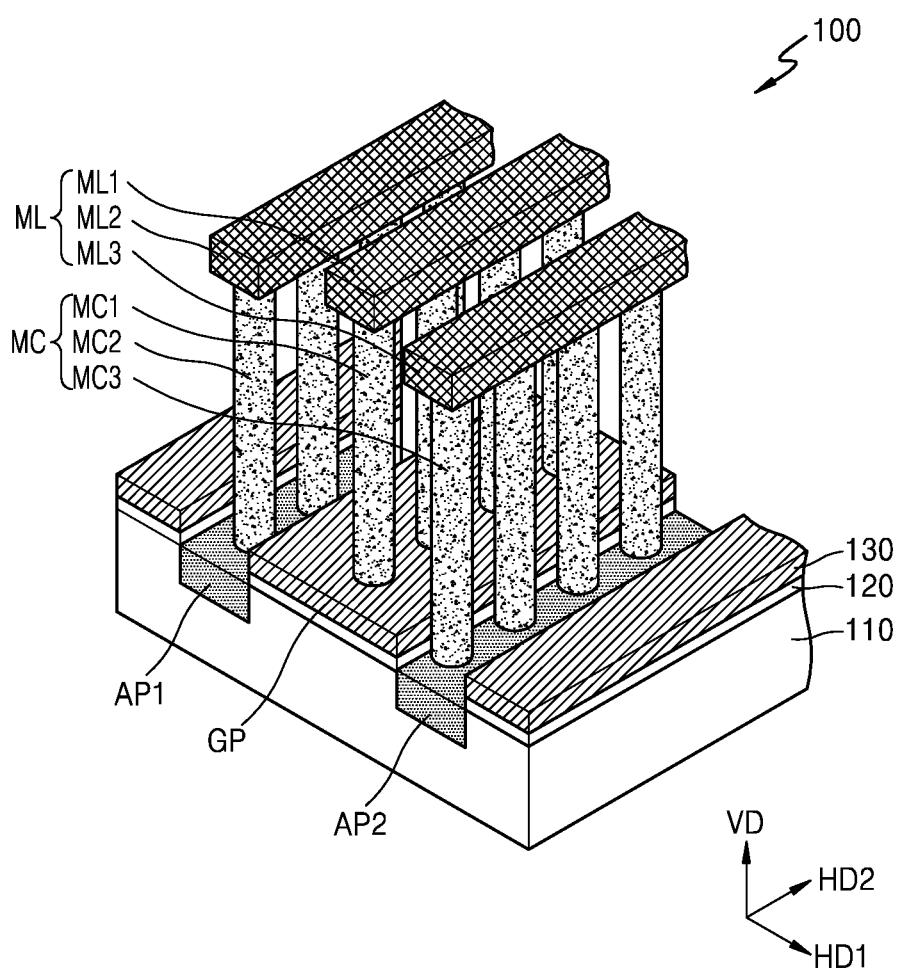
FIG. 1 is a perspective view of a vertical capacitor structure according to an embodiment of the inventive concept.

FIG. 1 is a perspective view of a vertical capacitor structure 100 according to an embodiment.

Referring to FIG. 1, the vertical capacitor structure 100 may include a substrate 110, a gate insulating film 120, a gate electrode 130, first and second active patterns AP1 and AP2, and a plurality of capacitor electrodes MC. The substrate 110 may be a semiconductor substrate. For example, the semiconductor substrate may include any one of silicon, silicon-on-insulator, silicon-on-sapphire, germanium, silicon-germanium, and gallium-arsenic. For example, the substrate 110 may include a P-type substrate. A main surface of the substrate 110 may extend in a first horizontal direction HD1 and a second horizontal direction HD2.

The gate insulating film 120 may be located on the substrate 110. For example, the gate insulating film 120 may include a metal oxide having a high dielectric constant, for example, zirconium oxide (ZrO2), aluminum oxide (Al2O3), tantalum oxide (Ta2O3), or hafnium oxide (HfO2). However, the gate insulating film 120 is not limited thereto. The gate insulating film 120 may be formed by using an oxide-based material such as silicon oxide, silicon carbonate, or silicon oxyfluoride. The gate electrode 130 may be located on the gate insulating film 120. The gate electrode 130 may include a metal material such as tungsten (W), tantalum (Ta) or the like, a nitride thereof, a silicide thereof, a doped polysilicon, or the like, and may be formed by using a deposition process.

A patterning process may be performed on the gate insulating film 120 and the gate electrode 130. Accordingly, the gate insulating film 120 may be patterned into a plurality of gate insulating patterns and the gate electrode 130 may be patterned into a plurality of gate patterns including a gate pattern GP or a plurality of gate electrode patterns. Some regions of the substrate 110 may be exposed by the above-mentioned patterning process and the first and second active patterns AP1 and AP2 may be formed on the exposed regions of the substrate 110.

The first and second active patterns AP1 and AP2 may extend in/on the substrate 110 in the second horizontal direction HD2. For example, the first and second active patterns AP1 and AP2 may be formed by doping the exposed regions of the substrate 110 with a first conductivity type dopant, for example, with N+ impurities. In some examples, the first and second active patterns AP1 and AP2 may be formed by doping the exposed regions of the substrate 110 with a second conductivity type dopant, for example, with P+ impurities. Therefore, the first and second active patterns AP1 and AP2 may be referred to as impurity regions. In addition, the first and second active patterns AP1 and AP2 may be located on both sides of the gate pattern GP. Therefore, the first and second active patterns AP1 and AP2 may be referred to as source/drain regions.

The plurality of capacitor electrodes MC may be located on the gate pattern GP and the first and second active patterns AP1 and AP2 and extend above the substrate 110 in a vertical direction VD. The plurality of capacitor electrodes MC may include a conductive material, for example, a metal material. Accordingly, the plurality of capacitor electrodes MC may be referred to as a plurality of metal contacts (MC). The plurality of capacitor electrodes MC may include first to third capacitor electrodes MC1, MC2, and MC3. The first capacitor electrode MC1 may be located on the gate pattern GP, the second capacitor electrode MC2 may be located on the first active pattern AP1, and the third capacitor electrode MC3 may be located on the second active pattern AP2.

A metal layer ML may be located on the plurality of capacitor electrodes MC and may extend in the second horizontal direction HD2. The metal layer ML may include a first metal line ML1 located above the gate pattern GP and in contact with the first capacitor electrode MC1, a second metal line ML2 located above the first active pattern AP1 and in contact with the second capacitor electrode MC2, and a second metal line ML3 located above the second active pattern AP2 and in contact with the third capacitor electrode MC3. Although not illustrated in the drawings, another metal layer may be further located above the metal layer ML and a stud or a contact including a conductive material may be located between the metal layer ML and the other metal layer.

For example, the plurality of capacitor electrodes MC or the metal layer ML may include metal materials including tungsten (W), tungsten nitride (WN), titanium (Ti), titanium nitride (TiN), tantalum (Ta), tantalum nitride (TaN), cobalt (Co), and aluminum (Al) or silicide materials including polysilicon, tungsten silicide (WSi), cobalt silicide (CoSi), and nickel silicide (NiSi), or a combination of the metal materials and the silicide materials.

The vertical capacitor structure 100 may use the gate pattern GP and the first and second active patterns AP1 and AP2 as a lower portion structure and use the plurality of capacitor electrodes MC as an upper portion structure. Herein, the lower portion structure of the vertical capacitor structure 100 may have a structure similar to that of a metal-oxide-semiconductor (MOS) transistor. However, unlike the MOS transistor, the same voltage (for example, a second voltage V2 in FIG. 2) may be applied to the first and second active patterns AP1 and AP2. Therefore, the lower portion structure of the vertical capacitor structure 100 may not operate as a MOS transistor and a turn-on current may not flow in a channel region between the first and second active patterns AP1 and AP2.

Figure 2:
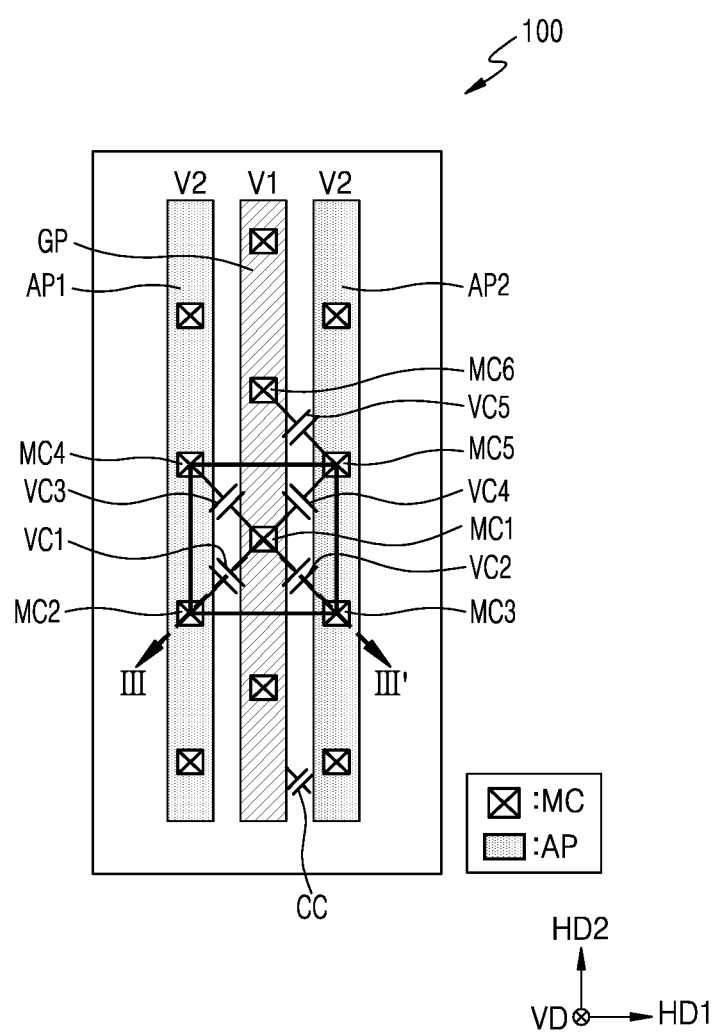
FIG. 2 is a layout of the vertical capacitor structure of FIG. 1, according to an embodiment of the inventive concept.

FIG. 2 is a layout of the vertical capacitor structure 100 of FIG. 1, according to an embodiment.

Referring to FIG. 2, active patterns AP including the first and second active patterns AP1 and AP2 may be apart from each other in the first horizontal direction HD1 and may extend in the second horizontal direction HD2. The gate pattern GP may be located on an upper portion between the first and second active patterns AP1 and AP2 and may extend in the second horizontal direction HD2. Although the first active pattern AP1 and the gate pattern GP are shown apart in the first horizontal direction HD1 in FIG. 2, the embodiment is not limited thereto. In an embodiment, an edge of the first active pattern AP1 may be in contact with an edge of the gate pattern GP on the layout. In addition, in an embodiment, some regions of the first active pattern AP1 may overlap the gate pattern GP.

The plurality of capacitor electrodes MC including the first capacitor electrode MC1 and a sixth capacitor electrode MC6 located on the gate pattern GP are apart from each other in the second horizontal direction HD2. The plurality of capacitor electrodes MC including the second capacitor electrode MC2 and a fourth capacitor electrode MC4 located on the first active pattern AP1 are apart from each other in the second horizontal direction HD2. The plurality of capacitor electrodes MC including the third capacitor electrode MC3 and a fifth capacitor electrode MC5 located on the second active pattern AP2 are apart from each other in the second horizontal direction HD2. In an embodiment, the number of capacitor electrodes MC located on the gate pattern GP may be equal to a number of capacitor electrodes MC located on the first active pattern AP1 or a number of capacitor electrodes MC located on the second active pattern AP2.

A first voltage V1 is applied to the gate pattern GP through the plurality of capacitor electrodes MC and a second voltage V2 may be applied to the first and second active patterns AP1 and AP2 through the plurality of capacitor electrodes MC, the second voltage V2 being different from the first voltage V1. In some examples, the first voltage V1 is a higher voltage greater than a power supply voltage VCC and the second voltage V2 may be less than the first voltage V1. In some examples, the first voltage V1 is a higher voltage greater than a power supply voltage VCC and the second voltage V2 may be equal to the power supply voltage VCC or a ground voltage GND. Herein, the power supply voltage VCC may be supplied from outside the memory device to particular circuits of a peripheral circuit 720 shown in FIG. 12. In some examples, an internal voltage (e.g., a voltage less than VCC) may be generated internally and supplied to particular circuits of the peripheral circuit 720. Accordingly, a plurality of vertical capacitors including first to fifth vertical capacitors VC1 to VC5 may be formed between the capacitor electrodes MC to which different voltages are applied.

For example, the first vertical capacitor VC1 may be formed between the first capacitor electrode MC1 and the second capacitor electrode MC2, and the second vertical capacitor VC2 may be formed between the first capacitor electrode MC1 and the third capacitor electrode MC3. In addition, the third vertical capacitor VC3 may be formed between the first capacitor electrode MC1 and the fourth capacitor electrode MC4, and the fourth vertical capacitor VC4 may be formed between the first capacitor electrode MC1 and the fifth capacitor electrode MC5. Furthermore, the fifth vertical capacitor VC5 may be formed between the sixth capacitor electrode MC6 and the fifth capacitor electrode MC5. As described above, according to an embodiment, since the plurality of capacitor electrodes MC are located over an entire area of the gate pattern GP, a number of vertical capacitors may be increased.

In addition, the gate pattern GP may form a channel region (CH in FIG. 3) between the first and second active patterns AP1 and AP2 and a channel capacitor CC between the gate pattern GP and the channel region CH. As described above, since the vertical capacitor structure 100 may include not only the vertical capacitors VC but also the channel capacitor CC, an integration degree of a capacitor of the vertical capacitor structure 100 may be improved and a capacitance per unit area may be further increased.

In an embodiment, the first capacitor electrode MC1 and the second capacitor electrode MC2 may not be adjacent in the first horizontal direction HD1, and the first capacitor electrode MC1 and the third capacitor electrode MC3 may not be adjacent in the first horizontal direction HD1. For example, the first to third capacitor electrodes MC1, MC2, and MC3 may be arranged in a zigzag form in the first horizontal direction HD1. However, the inventive concept is not limited thereto. In an embodiment, the first to third capacitor electrodes MC1, MC2, and MC3 may be arranged in a row in the first horizontal direction HD1.

Figure 3:
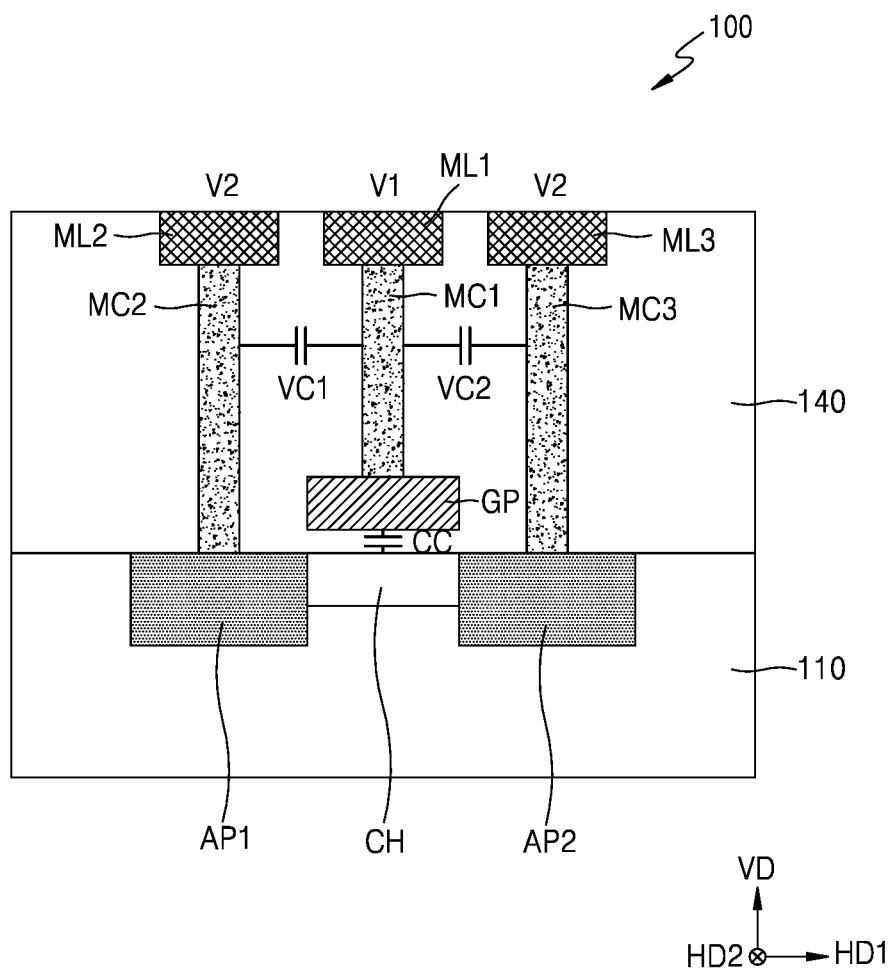
FIG. 3 is a cross-sectional view of a vertical capacitor structure taken along line of FIG. 2, according to an embodiment of the inventive concept.

FIG. 3 is a cross-sectional view of the vertical capacitor structure 100 taken along line III-III' of FIG. 2, according to an embodiment.

Referring to FIG. 3, the first and second active patterns AP1 and AP2 may be defined in the substrate 110 and the channel region CH may be defined between the first and second active patterns AP1 and AP2. The first to third capacitor electrodes MC1, MC2, and MC3 may be respectively located on the gate pattern GP and the first and second active patterns AP1 and AP2, and the first to third metal lines ML1, ML2, and ML3 may be respectively located on the first to third capacitor electrodes MC1, MC2, and MC3. The vertical capacitor structure 100 may further include an interlayer insulating film 140 above the substrate 110.

In an embodiment, the first voltage V1 may be applied to the first metal line ML1 and the second voltage V2 may be applied to the second to third metal lines ML2 and ML3, the second voltage V2 being different from the first voltage V1. Accordingly, the first voltage V1 may be applied to the gate pattern GP and the second voltage V2 may be applied to the first and second active patterns AP1 and AP2. As described above, since the same second voltage V2 is applied to the first and second active patterns AP1 and AP2, the turn-on current may not flow in the channel region CH and charges in the channel region CH may be in a trapped state. Therefore, the gate pattern GP and the first and second active patterns AP1 and AP2 may not form a MOS transistor.

According to an embodiment, the gate pattern GP and the channel region CH may form the channel capacitor CC. The first capacitor electrode MC1 and the second capacitor electrode MC2 may form the first vertical capacitor VC1. The first capacitor electrode MC1 and the third capacitor electrode MC3 may form the second vertical capacitor VC2. As described above, since the vertical capacitor structure 100 may realize the channel capacitor CC and the first and second vertical capacitors VC1 and VC2 by including the gate pattern GP, the first and second active patterns AP1 and AP2, and the first to third capacitor electrodes MC1, MC2, and MC3, the capacitance per unit area may be increased.

A vertical capacitor structure of the related art may only realize a vertical capacitor between capacitor electrodes by not including the first and second active patterns but including only gate patterns and the capacitor electrodes located on the gate patterns. However, the vertical capacitor structure 100 according to the embodiment may further obtain the channel capacitor CC between the channel region CH, which is between the first and second active patterns AP1 and AP2, and the gate pattern GP by further including the first and second active patterns AP1 and AP2, and second and third capacitor electrodes MC2 and MC3 located on the first and second active patterns AP1 and AP2. Accordingly, the vertical capacitor structure 100 may increase a capacitance which may be obtained in the same area.

In an embodiment, a voltage level of the second voltage V2 may be lower than a voltage level of the first voltage V1. For example, the voltage level of the second voltage V2 may be similar to a voltage level of a voltage applied to a low-voltage transistor (for example, 600 in FIG. 11). Herein, the low-voltage transistor may be applied a low voltage equal to or less than a power supply voltage VCC (e.g., if VCC is 3V, a low voltage is equal to or less than 3V). For example, the voltage level of the second voltage V2 may be similar to a voltage level of a source voltage (V_S in FIG. 11) applied to a first active pattern (610a in FIG. 11) of the low-voltage transistor (600 in FIG. 11) or a voltage level of a drain voltage (V_D of FIG. 11) applied to a second active pattern (610b in FIG. 11) of the low-voltage transistor (600 in FIG. 11). Hereby, a junction breakdown between the first and second active patterns AP1 and AP2, and the substrate 110 and/or a breakdown between the first active pattern AP1 and the second active pattern AP2 may be prevented.

In example embodiments, a charge pump 725 (in FIG. 12) may include the vertical capacitor structure 100 to generate a high voltage. For example, the charge pump 725 may be connected to the first metal line ML1 of the vertical capacitor structure 100 to apply the first voltage V1. A clock buffer (not shown) may output a clock signal CLK or an inverted clock signal CLKB that is connected to the third metal lines ML2 and ML3 of the vertical capacitor structure 100 to apply the second voltage V2. The clock signal CLK may be a plurality of pulse signals having a plurality of rising and falling edges between a low voltage level (e.g., a ground voltage GND) and a high voltage level (e.g., a power supply voltage VCC).

Figure 4:
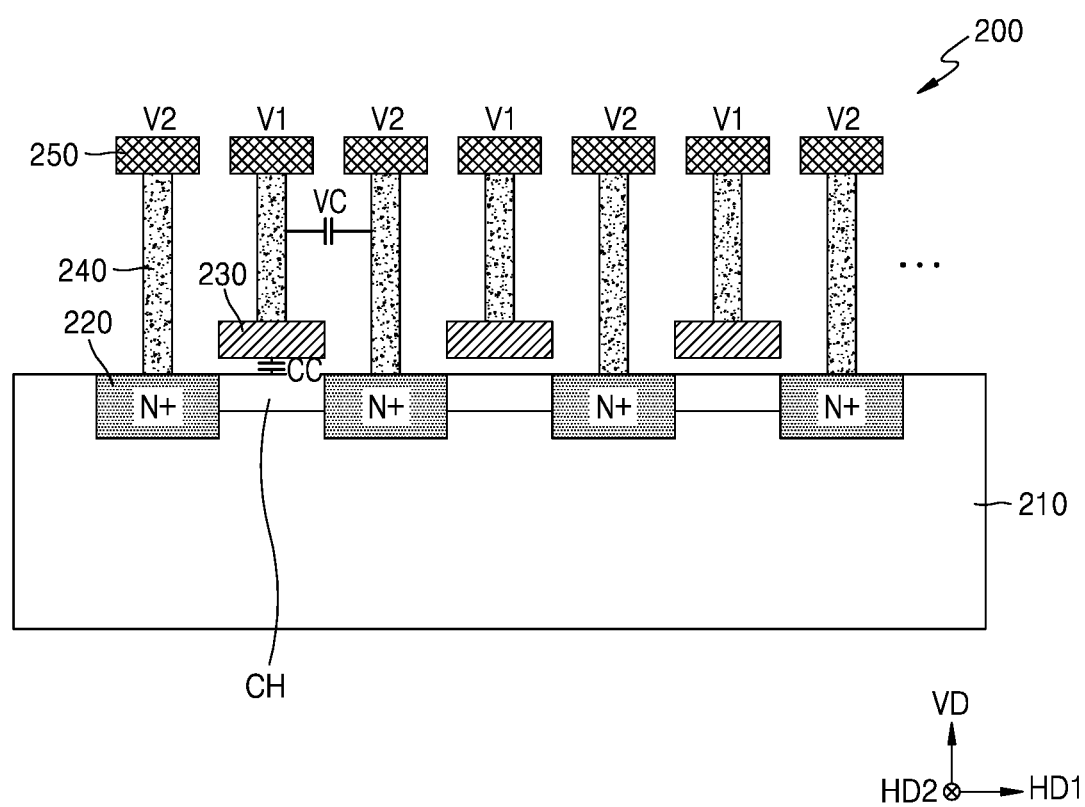
FIG. 4 is a cross-sectional view of a vertical capacitor structure according to an embodiment of the inventive concept.

FIG. 4 is a cross-sectional view of a vertical capacitor structure 200 according to an embodiment.

Referring to FIG. 4, the vertical capacitor structure 200 may include a substrate 210, a plurality of active patterns 220, and a plurality of gate patterns 230. The active patterns 220 and the gate patterns 230 may be referred to as a lower portion structure of the vertical capacitor structure 200. The active patterns 220 may be formed in the substrate 210 by doping the first conductivity type, for example, N+ impurities. In some examples, the active patterns 220 may be formed in the substrate 210 by doping the second conductivity type, for example, P+ impurities. The active patterns 220 may be arranged apart from each other at certain spaces in the first horizontal direction HD1 and may extend in the second horizontal direction HD2. The gate patterns 230 may be located above the substrate 210, and a gate insulating film (for example, 120 in FIG. 1) may be located between the gate patterns 230 and the substrate 210. The gate patterns 230 may be arranged apart from each other at certain spaces in the first horizontal direction HD1 and may extend in the second horizontal direction HD2.

The vertical capacitor structure 200 may further include capacitor electrodes 240 and a metal layer 250. The capacitor electrodes 240 and the metal layer 250 may be referred to as an upper portion structure of the vertical capacitor structure 200. In an embodiment, a first voltage V1 may be applied to the capacitor electrodes 240 respectively located on the gate patterns 230 and a second voltage V2 may be applied to the capacitor electrodes 240 respectively located on the active patterns 220.

Different voltages such as the first and second voltages V1 and V2 may be applied to the capacitor electrodes 240 adjacent to each other in the first horizontal direction HD1. Accordingly, the capacitor electrodes 240, which are adjacent, may form a vertical capacitor VC. In addition, since the second voltage V2 is applied to all of the active patterns 220, a turn-on current may not flow in a channel region CH between the active patterns 220, which are adjacent. Accordingly, each of the gate patterns 230 and the channel region CH may form a channel capacitor CC.

Figure 5:
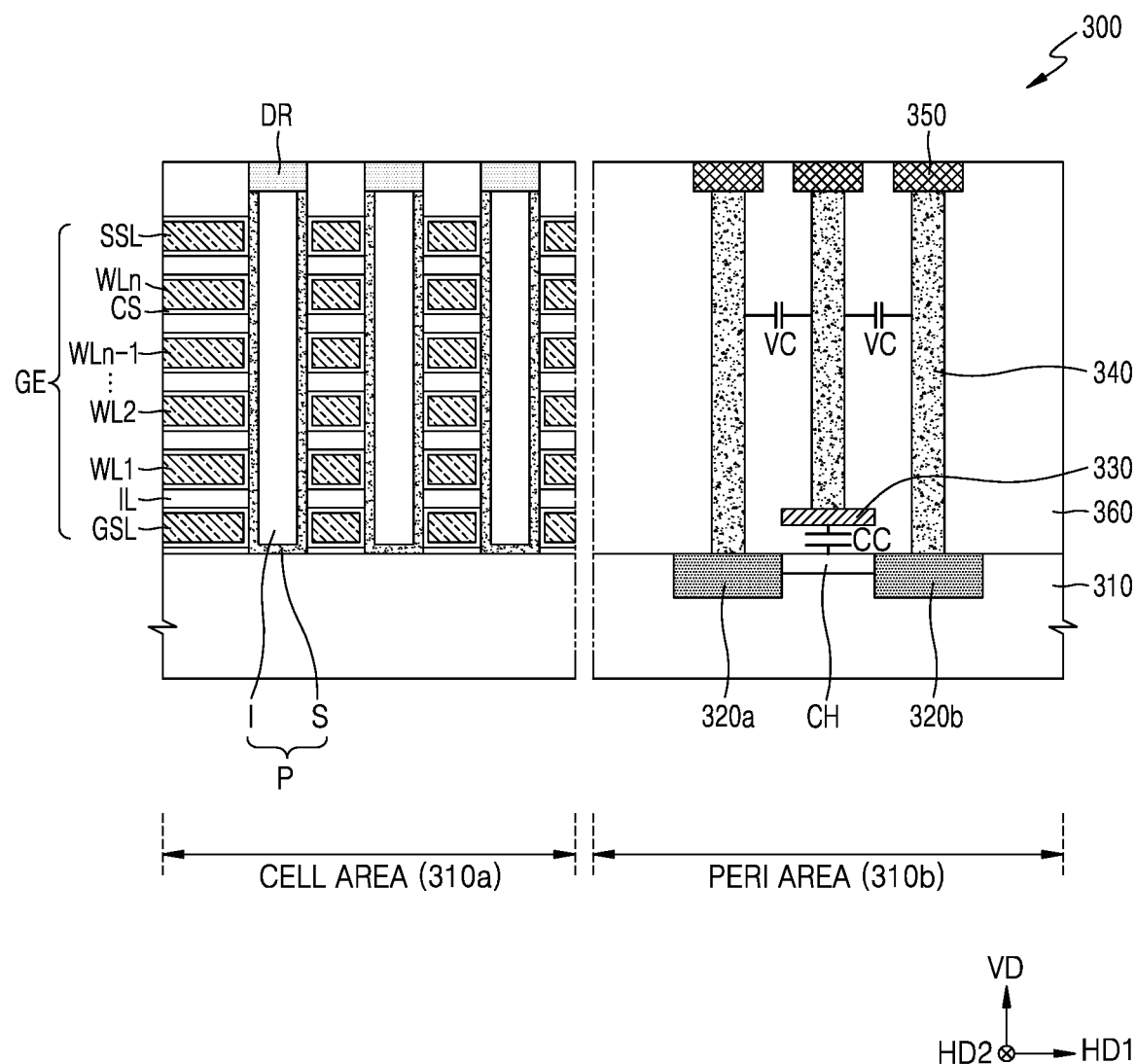
FIG. 5 is a cross-sectional view of a non-volatile memory device according to an embodiment of the inventive concept.
Figure 6:
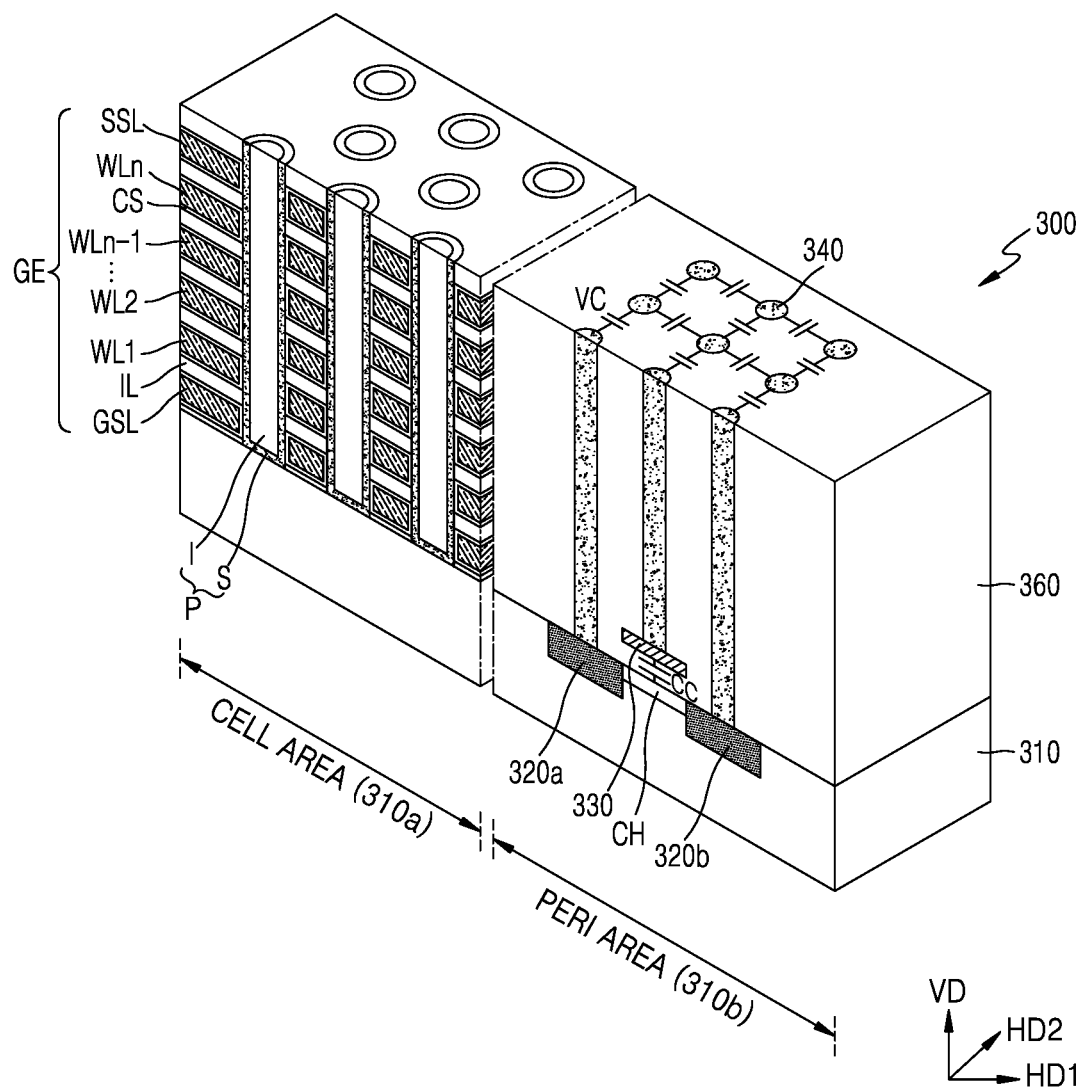
FIG. 6 is a perspective view of a non-volatile memory device according to an embodiment of the inventive concept.

FIG. 5 is a cross-sectional view of a non-volatile memory device 300 according to an embodiment. FIG. 6 is a perspective view of the non-volatile memory device 300 according to an embodiment.

Referring to FIGS. 5 and 6, a substrate 310 may have a memory cell area 310a and a peripheral circuit area 310b. Although not illustrated in the drawings, an element isolation film may be arranged between the memory cell area 310a and the peripheral circuit area 310b. The element isolation film may extend in the second horizontal direction HD2. The element isolation film may include an insulating material including a silicon oxide film or a silicon nitride film.

A plurality of memory cell strings (for example, MCS in FIG. 7) may be located above the memory cell area 310a, and each of the memory cell strings may include a vertical channel structure or a pillar P and a plurality of memory cells. The vertical channel structure P may extend in a vertical direction VD, and the plurality of memory cells may be arranged adjacent to each other in the vertical direction VD along the vertical channel structure P.

A plurality of insulating films IL may be provided above the memory cell area 310a and for example, the plurality of insulating films IL may include an insulating material such as a silicon oxide. A plurality of vertical channel structures P may penetrate the plurality of insulating films IL in the vertical direction VD. For example, the plurality of vertical channel structures P may penetrate the plurality of insulating films IL to contact the substrate 310.

In detail, a surface layer S of each vertical channel structure P may include a silicon material of a first type (for example, a P-type) and may function as the channel region CH. Meanwhile, an inner layer I of each vertical channel structure P may include an insulating material such as silicon oxide or an air gap. The plurality of vertical channel structures P may be arranged apart from each other in the first horizontal direction HD1 and the second horizontal direction HD2. For example, the plurality of vertical channel structures P may be formed in an annular shape. However, the inventive concept is not limited thereto. The plurality of vertical channel structures P may be formed in a form of an elliptic cylinder or a square pillar.

A charge storage layer CS may be provided along an exposed surface of the plurality of insulating films IL and the plurality of vertical channel structures P. The charge storage layer CS may include a gate insulating layer (or also referred to as a "tunneling insulating layer"), a charge trap layer, and a blocking insulating layer. For example, the charge storage layer CS may have an oxide-nitride-oxide (ONO) structure. In addition, a gate electrode GE including a ground selection line GSL, word lines WL1 to WLn, and a string selection line SSL may be provided on the exposed surface of the charge storage layer CS. Herein, n may be a positive integer.

Figure 7:
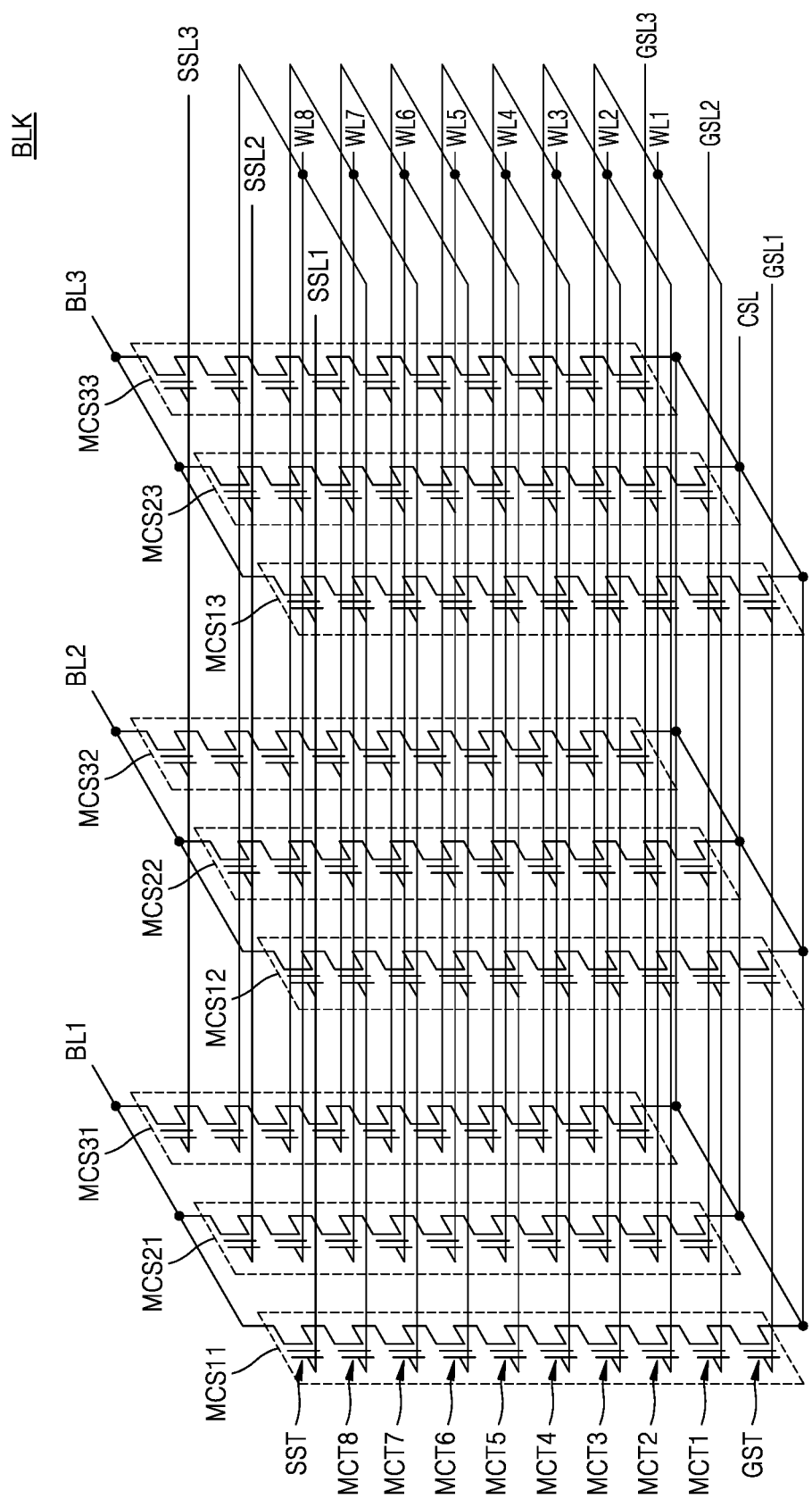
FIG. 7 is a circuit diagram illustrating an example of a memory block according to an embodiment of the inventive concept.

The word lines WL1 to WLn, the charge storage layer CS, and the vertical channel structure P may form memory cell transistors or memory cells (for example, MCT1 to MCT8 in FIG. 7). The ground selection line GSL, the charge storage layer CS, and the vertical channel structure P may form a ground selection transistor (for example, GST in FIG. 7). The string selection line SSL, the charge storage layer CS, and the vertical channel structure P may form a string selection transistor (for example, SST in FIG. 7).

The plurality of insulating films IL may be located between word lines that are adjacent to each other in the vertical direction VD.

Drains or drain contacts DR may be respectively provided on the plurality of vertical channel structures P. For example, the drains or drain contacts DR may include a silicon material doped with impurities of the second conductivity type (for example, N-type). Bit lines may be provided on the drain contacts DR.

In the peripheral circuit area 310b, for example, a vertical capacitor structure such as the vertical capacitor structure 100 of FIGS. 1 to 3 or the vertical capacitor structure 200 of FIG. 4 may be formed. Therefore, descriptions given above with reference to FIGS. 1 to 4 may be applied to the present embodiment, and redundant descriptions will be omitted. In detail, first and second active patterns 320a and 320b doped with impurities having the second conductivity type (N+) may be defined in the peripheral circuit area 310b. In some examples, the first and second active patterns 320a and 320b doped with impurities of the first conductivity type (P+) may be defined in the peripheral circuit area 310b. A channel region CH may be formed between the first and second active patterns 320a and 320b and a gate pattern 330 may be located above the channel region CH.

A gate insulating film (for example, 120 in FIG. 1) may be located between the gate pattern 330 and the channel region CH. The channel capacitor CC may be formed between the gate pattern 330 and the channel region CH. In an embodiment, a thickness of the gate insulating film of a vertical capacitor structure such as the vertical capacitor structure 100 of FIGS. 1 to 3 or the vertical capacitor structure 200 of FIG. 4 may be greater than a distance between two adjacent word lines in the vertical direction VD. The distance between two adjacent word lines in the vertical direction VD may be a thickness of a corresponding insulating film IL.

A plurality of capacitor electrodes 340 may be located on the gate pattern 330 and the first and second active patterns 320a and 320b, and may extend in the vertical direction VD. An interlayer insulating film 360 may be above the substrate 310 and the plurality of capacitor electrodes 340 may penetrate the interlayer insulating film 360 in the vertical direction VD. A metal layer 350 may be located on the plurality of capacitor electrodes 340.

FIG. 7 is a circuit diagram exemplarily illustrating a memory block BLK according to an embodiment.

Referring to FIG. 7, the memory block BLK may be located in the memory cell area 310a of FIG. 5 or FIG. 6. The memory block BLK may include memory cell strings MCS11 to MCS31, MCS12 to MCS32, and MCS13 to MCS33, word lines WL1 to WL8, a ground selection line GSL, a string selection line SSL, and a common source line CSL.

The memory cell strings MCS11 to MCS31 are provided between a first bit line BL1 and the common source line CSL. The memory cell strings MCS12 to MCS32 are provided between a second bit line BL2 and the common source line CSL. The memory cell strings MCS13 to MCS33 are provided between a third bit line BL3 and the common source line CSL. Each of the memory cell strings (for example, MCS11) may include a string selection transistor SST, a plurality of memory cells MCT1 to MCT8, and the ground selection transistor GST, which are connected in series.

The string selection transistor SST is connected to a corresponding one of the string selection lines SSL1 to SSL3. The plurality of memory cells MC1 to MC8 are respectively connected to corresponding one of the word lines WL1 to WL8. The ground selection transistor GST is connected to corresponding one of the ground selection lines GSL1 to GSL3. The string selection transistor SST is connected to corresponding one of the bit lines BL1 to BL3, and the ground selection transistor GST is connected to the common source line CSL.

In the present embodiment, the word lines of the same height (for example, WL1) are commonly connected to each other, the string selection lines SSL1 to SSL3 are separated from each other, and the ground selection lines GSL1 to GSL3 are separated from each other. Although the three string selection lines SSL1 to SSL3 are shown as sharing a word line of the same height in FIG. 7, the inventive concept is not limited thereto. For example, two string selection lines may share a word line of the same height. As another example, four string selection lines may share a word line of the same height.

Figure 8:
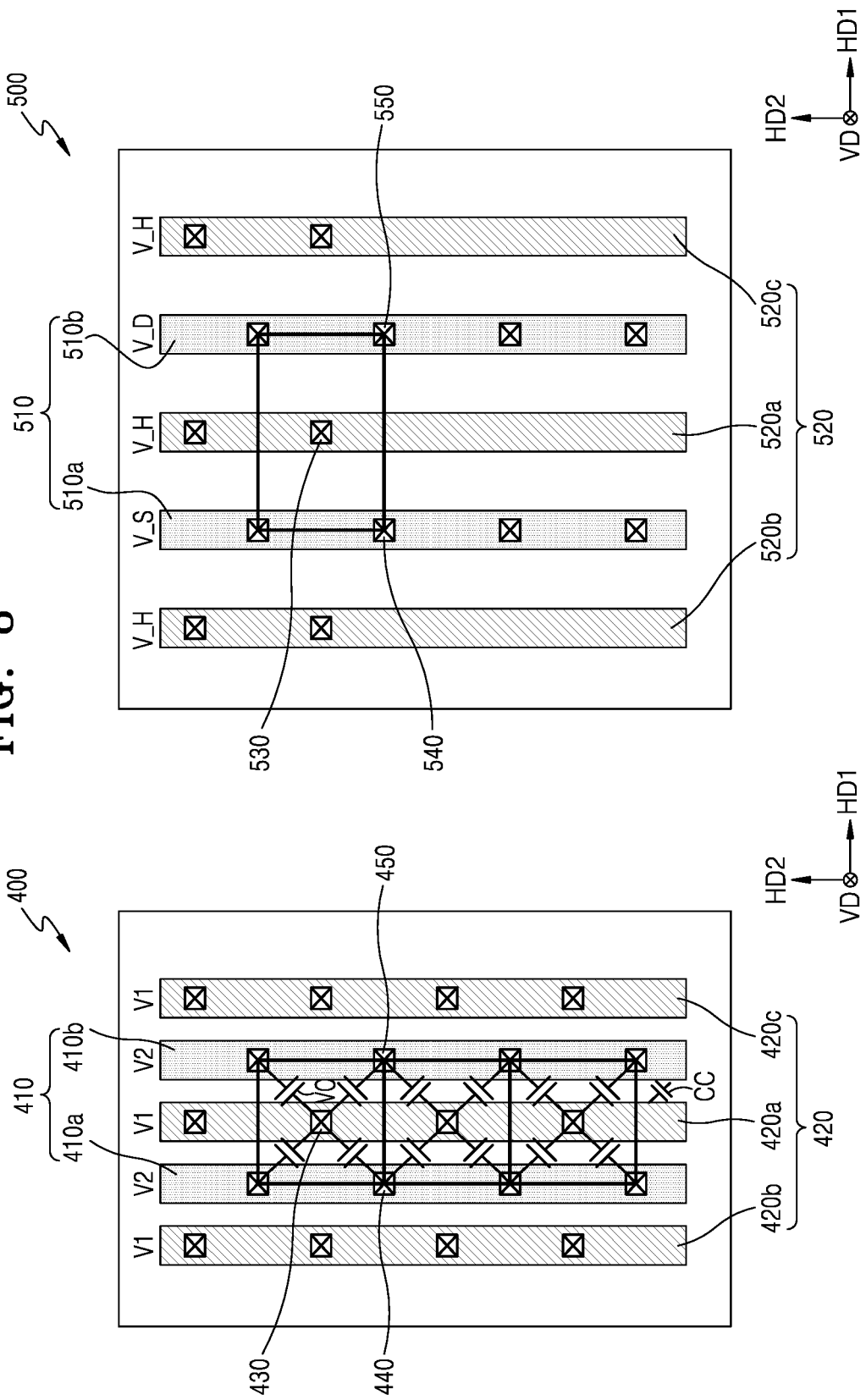
FIG. 8 illustrates layouts of a vertical capacitor structure according to an embodiment of the inventive concept and a high-voltage transistor according to a comparative embodiment.

FIG. 8 illustrates layouts of a vertical capacitor structure 400 according to an embodiment and a high-voltage transistor 500 according to a comparative embodiment. Herein, the high-voltage transistor may be applied a high voltage greater than a power supply voltage VCC (e.g., if VCC is 3V, a high voltage is greater than 3V).

Referring to FIG. 8, the vertical capacitor structure 400 may include active patterns 410 and gate patterns 420 both extending in the second horizontal direction HD2. The active patterns 410 may include first and second active patterns 410a and 410b, which are apart from each other in the first horizontal direction HD1. The gate patterns 420 may include first to third gate patterns 420a, 420b, and 420c, which are apart from each other in the first horizontal direction HD1.

A plurality of first capacitor electrodes 430 extending in the vertical direction VD may be above each of the first to third gate patterns 420a, 420b, and 420c. A plurality of second capacitor electrodes 440 extending in the vertical direction VD may be above the first active pattern 410a. A plurality of third capacitor electrodes 450 extending in the vertical direction VD may be above the second active pattern 410b. In an embodiment, the number of first capacitor electrodes 430 above each of the first to third gate patterns 420a, 420b, and 420c may be the same as or similar to the number of respective second capacitor electrodes 440 and the number of third capacitor electrodes 450.

In an embodiment, the first voltage V1 may be applied to the gate patterns through the plurality of first capacitor electrodes 430, the second voltage V2 may be applied to the first active pattern 410a through the plurality of second capacitor electrodes 440, and the second voltage V2 may be applied to the second active pattern 410b through the plurality of third capacitor electrodes 450. Accordingly, a turn-on current may not flow in a channel region between the first and second active patterns 410a and 410b, and the first gate pattern 420a may form a channel region and a channel capacitor CC in the lower portion.

In addition, the first and second capacitor electrodes 430 and 440, which are adjacent to each other, may form a vertical capacitor VC and the first and third capacitor electrodes 430 and 450, which are adjacent to each other, may form a vertical capacitor VC. According to the present embodiment, since the first capacitor electrodes 430 are located over the entire area of each of the first to third gate patterns 420a, 420b, and 420c, the number of vertical capacitors may also be increased. Therefore, a capacitance of the vertical capacitor structure 400 may be very large.

Meanwhile, the high-voltage transistor 500 may include active patterns 510 and gate patterns 520 both extending in the second horizontal direction HD2. The active patterns 510 may include first and second active patterns 510a and 510b which are apart from each other in the first horizontal direction HD1. The gate patterns 520 may include first to third gate patterns 520a, 520b, and 520c which are apart from each other in the first horizontal direction HD1.

First metal contacts 530 extending in the vertical direction VD may be above each of the first to third gate patterns 520a, 520b, and 520c. Second metal contacts 540 extending in the vertical direction VD may be above the first active pattern 510a. Third metal contacts 550 extending in the vertical direction VD may be above the second active pattern 510b. Herein, the number of first metal contacts 530 above each of the first to third gate patterns 520a, 520b, and 520c is limited in consideration of plasma damage. Therefore, the number of first metal contacts above each of the first to third gate patterns 520a, 520b, and 520c may be much less than the numbers of second metal contacts 540 and third metal contacts 550.

In addition, a high voltage V_H may be applied to the gate patterns 520 through a plurality of first metal contacts 530, a source voltage (V_S) may be applied to the first active pattern 510a through a plurality of second metal contacts 540, and a drain voltage V_D may be applied to the second active pattern 510b through a plurality of third metal contacts 550. Herein, the source voltage V_S and the drain voltage V_D may be different from each other, accordingly, a turn-on current may flow in a channel region between first and second active patterns 510a and 510b which are adjacent to each other. Therefore, the first gate pattern 520a and the first and second active patterns 510a and 510b may form a MOS transistor, and the first gate pattern 520a may not form a channel region and a channel capacitor CC in a lower portion structure of the high-voltage transistor 500. Herein, a voltage level of the high voltage V_H may be higher than a power supply voltage VCC.

Figure 9:
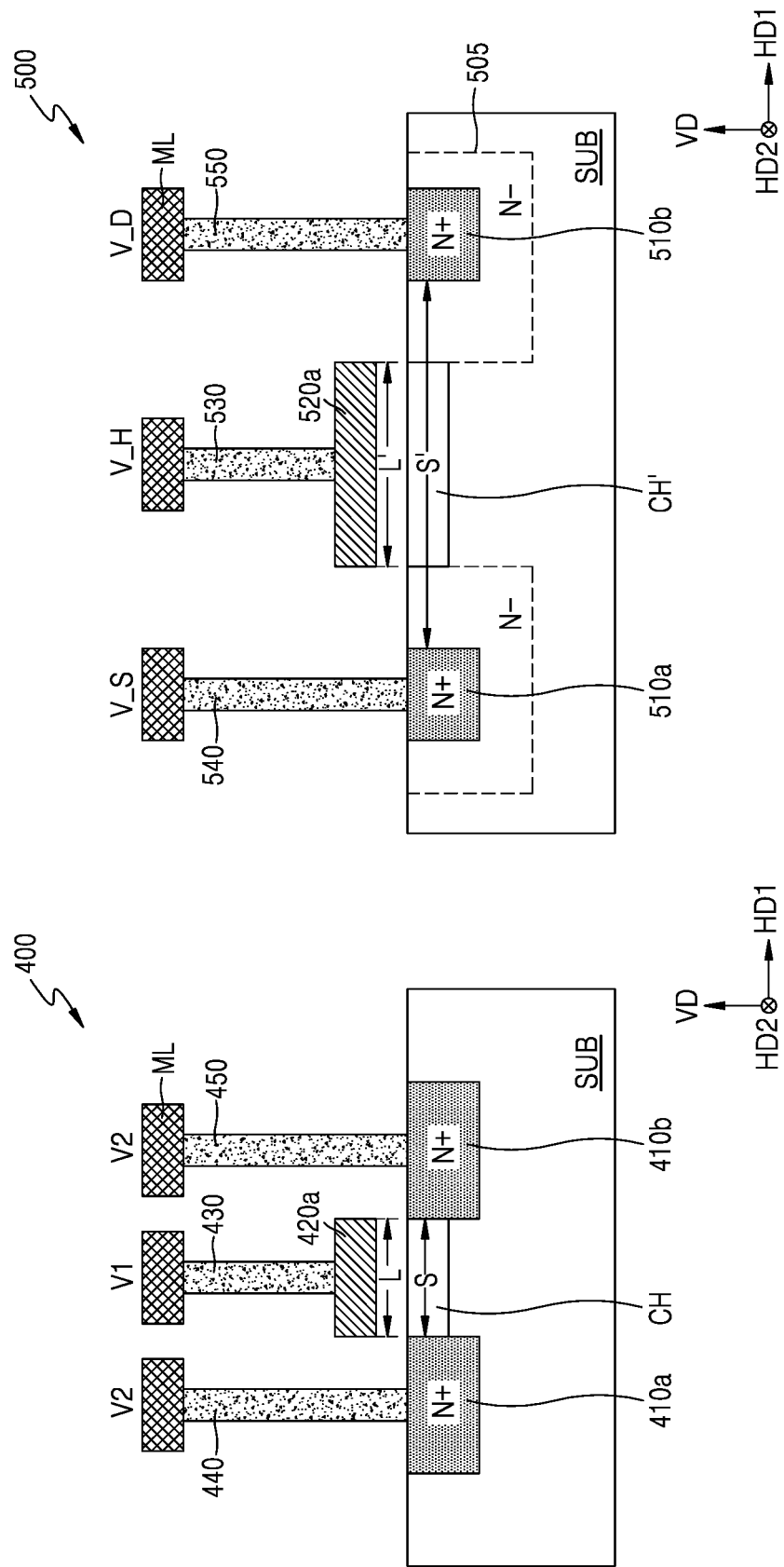
FIG. 9 illustrates cross-sectional views of a vertical capacitor structure according to an embodiment of the inventive concept and a high-voltage transistor according to a comparative embodiment.

FIG. 9 illustrates cross-sectional views of the vertical capacitor structure 400 according to an embodiment and the high-voltage transistor 500 according to a comparative embodiment.

Referring to FIGS. 8 and 9, in the vertical capacitor structure 400, the first gate pattern 420a may have a first length L along the first horizontal direction HD1. For example, the first length L may be as short as a gate length of a low-voltage transistor of the related art. A spacing S between the first and second active patterns 410a and 410b may be the same as a length of a channel region CH along the horizontal direction HD1. In an embodiment, the spacing S between the first and second active patterns 410a and 410b may be less than the first length L of the first gate pattern 420a. However, the inventive concept is not limited thereto. In some embodiments, the spacing S between the first and second active patterns 410a and 410b may be equal to the first length L of the first gate pattern 420a.

The first to third capacitor electrodes 430, 440, and 450 may be respectively located on the first gate pattern 420a, and the first and second active patterns 410a and 410b, and a metal layer ML may be located on the first to third capacitor electrodes 430, 440, and 450. The first voltage V1 may be applied to the first gate pattern 420a through the first capacitor electrode 430, and the second voltage V2 may be applied to the first and second active patterns 410a and 410b through the second and third capacitor electrodes 440 and 450.

Meanwhile, the high-voltage transistor 500 may include an impurity-doped region defined in a substrate SUB, for example, an N-doped region 505 (e.g., lightly doped drain LDD), and the first and second active patterns 510a and 510b (e.g., N⁺-doped region) may be defined in the N-doped region 505. The first gate pattern 520a may have a second length L' along the first horizontal direction HD1. Since a high voltage V_H is applied to the first gate pattern 520a, the second length L' may be greater than the first length L. Herein, a spacing S' between the first and second active patterns 510a and 510b may be greater than the second length L' of the first gate pattern 520a.

The first to third metal contacts 530, 540, and 550 may be respectively located on the first gate pattern 520a, and the first and second active patterns 510a and 510b, and the metal layer ML may be located on the first to third metal contacts 530, 540, and 550. The high voltage V_H may be applied to the first gate pattern 520a through the first metal contact 530, and the source voltage V_S and the drain voltage V_D may be respectively applied to the first and second active patterns 510a and 510b through the second and third metal contacts 540 and 550.

Although not shown, a thickness of a gate insulating film between the first gate pattern 420a and the channel region CH of the vertical capacitor structure 400 in the vertical direction VD may be the same as or similar to a thickness of a gate insulating film between the first gate pattern 520a and the channel region CH of the vertical capacitor structure 400 in the vertical direction VD.

Figure 10:
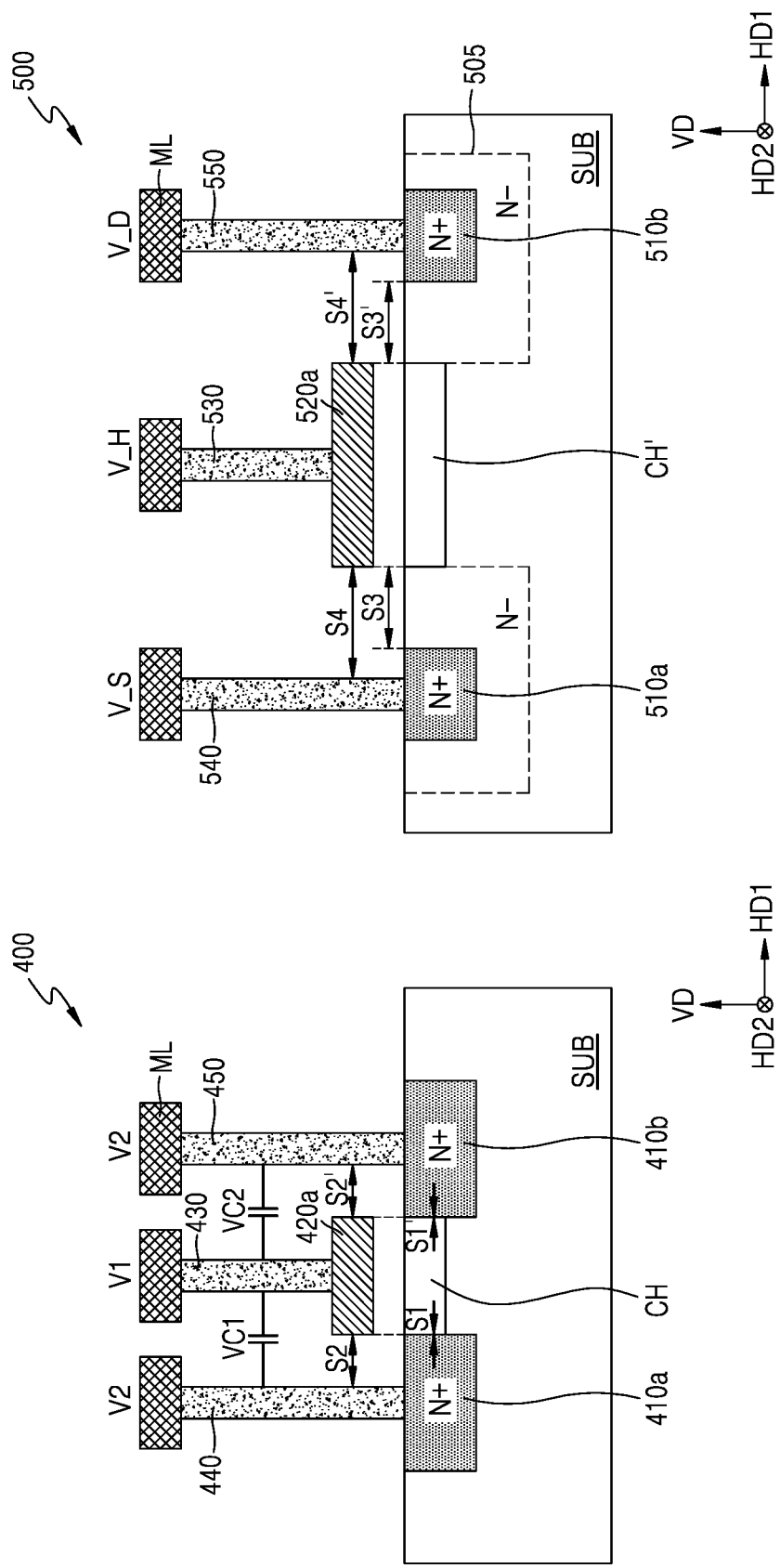
FIG. 10 illustrates cross-sectional views of a vertical capacitor structure according to an embodiment of the inventive concept and a high-voltage transistor according to a comparative embodiment.

FIG. 10 illustrates cross-sectional views of the vertical capacitor structure 400 according to an embodiment and the high-voltage transistor 500 according to a comparative embodiment.

Referring FIGS. 8 to 10, in the vertical capacitor structure 400, a first spacing S1 along the first horizontal direction HD1 between an edge of the first active pattern 410a and a first edge of the first gate pattern 420a may be very small. In addition, a first spacing S1' along the first horizontal direction HD1 between an edge of the second active pattern 410b and a second edge of the first gate pattern 420a opposite to the first edge may be very small. Although not shown, an N-doped (e.g., lightly doped drain LDD) region may be located within (e.g., fully extend across the horizontal direction HD1 of) each of the first spacing S1 and the first spacing S1'. Further, a first gate spacer may be formed on (and cover) the first edge of the first gate pattern 420a and a first edge of a gate insulating film, and a second gate spacer may be formed on (and cover) a second edge opposite to the first edge of the first gate pattern 420a and a second edge opposite to the first edge of the gate insulating film. In an embodiment, the vertical capacitor structure 400 may not include the first spacing S1 and the first spacing S1'. In an example embodiment, a right partial region of the first active pattern 410a may overlap with a left partial region of the first gate pattern 420a. Likewise, a left partial region of the second active pattern 410b may overlap with a right partial region of the first gate pattern 420a.

A second spacing S2 along the first horizontal direction HD1 between the first edge of the first gate pattern 420a and the second capacitor electrode 440 may be relatively small (e.g., smaller than a fourth spacing S4 of the high-voltage transistor 500). Accordingly, a spacing between the first capacitor electrode 430 and the second capacitor electrode 440 may be relatively small, and a capacitance of a first capacitor electrode VC1 formed by the first capacitor electrode 430 and the second capacitor electrode 440 may be relatively large.

Likewise, a second spacing S2' along the first horizontal direction HD1 between the second edge of the first gate pattern 420a and the third capacitor electrode 450 may be relatively small. Accordingly, a spacing between the first capacitor electrode 430 and the third capacitor electrode 450 may be relatively small, and a capacitance of a second vertical capacitor VC2 formed by the first capacitor electrode 430 and the third capacitor electrode 450 may be relatively large.

Meanwhile, the high-voltage transistor 500 may include the impurity-doped region defined in the substrate SUB, for example, the N-doped region 505, and the first and second active patterns 510a and 510 B may be defined in the N-doped region 505. A third spacing S3 along the first horizontal direction HD1 between an edge of the first active pattern 510a and a first edge of the first gate pattern 520a may be larger than the first spacing S1. In addition, a third spacing S3' along the first horizontal direction HD1 between an edge of the second active pattern 510b and a second edge opposite to the first edge of the first gate pattern 520a may be larger than the first spacing S1'. In example embodiments, when the vertical capacitor structure 400 includes the N-doped (e.g., lightly doped drain LDD) region within the first spacing S1 and the first spacing S1', the first spacing S1 may be less than the third spacing S3 and the first spacing S1' may be less than the third spacing S3'.

A fourth spacing S4 along the first horizontal direction HD1 between the first edge of the first gate pattern 520a and the second metal contact 540 may be larger than the second spacing S2. Accordingly, a spacing between the first metal contact 530 and the second metal contact 540 may be relatively large, and a capacitance between the first metal contact 530 and the second metal contact 540 may be relatively small.

Likewise, a fourth spacing S4' along the first horizontal direction HD1 between the second edge of first gate pattern 520a and the third metal contact 550 may be larger than the second spacing S2'. Accordingly, a spacing between the first metal contact 530 and the third metal contact 550 may be relatively large, and a capacitance between the first metal contact 530 and the third metal contact 550 may be relatively small.

In example embodiments, when the vertical capacitor structure 400 includes the N-doped (e.g., lightly doped drain LDD) region within the first spacing S1 and the first spacing S1', each of the first spacing S1 and the first spacing S1' may be less than each of the first spacing S1 and the first spacing S1'

Figure 11:
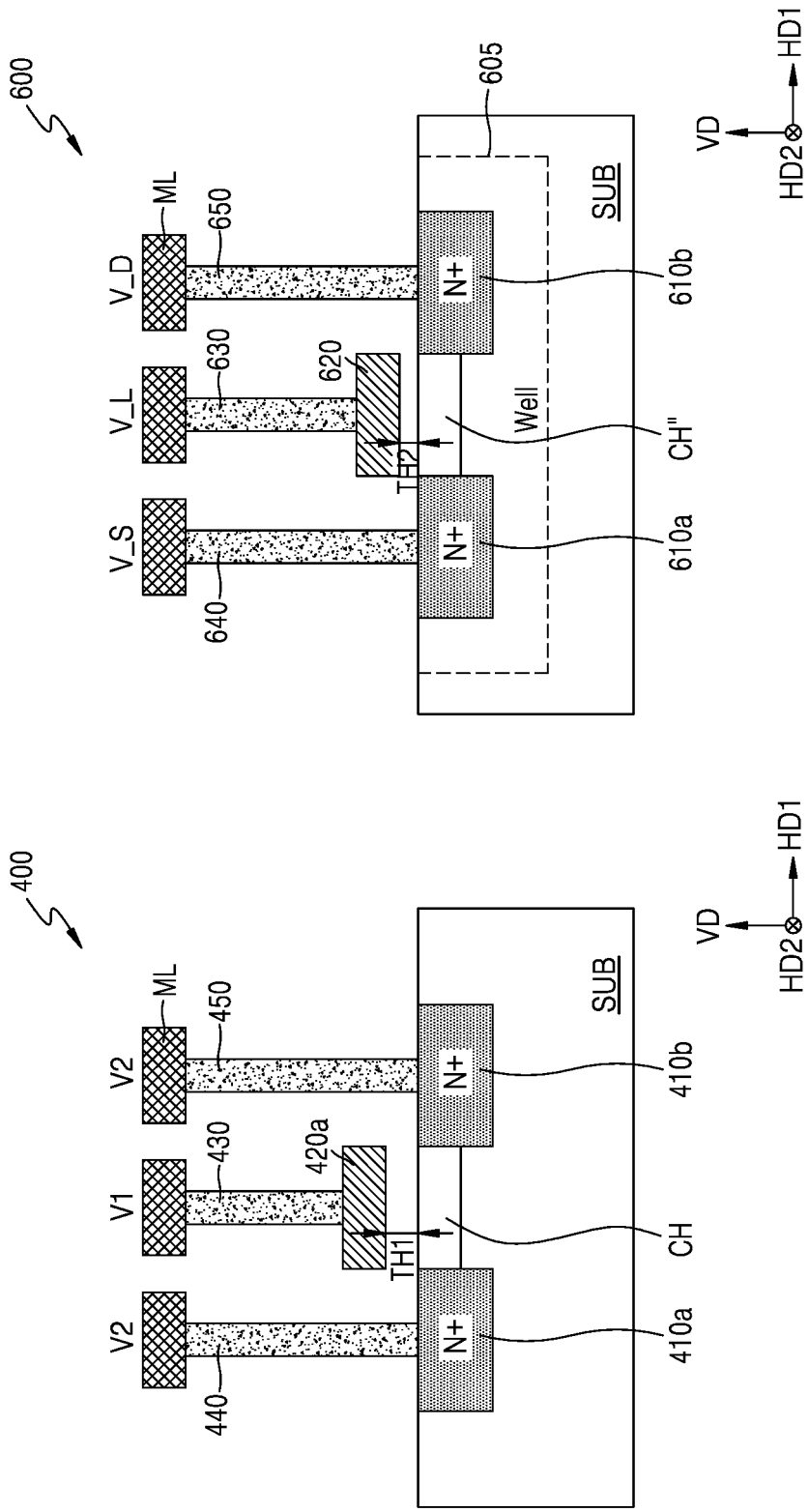
FIG. 11 illustrates cross-sectional views of a vertical capacitor structure according to an embodiment of the inventive concept and a low-voltage transistor according to a comparative embodiment.

FIG. 11 is cross-sectional views illustrating the vertical capacitor structure 400 according to an embodiment and a low-voltage transistor 600 according to a comparative embodiment.

Referring to FIG. 11, in the vertical capacitor structure 400, a length along the vertical direction VD between the first gate pattern 420a and the channel region CH, that is, a first thickness TH1 of the gate insulating film (120 in FIG. 1) may be significantly large (e.g., the first thickness TH1 is greater than a second thickness TH2 of a gate insulating film in the low-voltage transistor 600). For example, the first thickness TH1 is more than at least 2 times of the second thickness TH2. Accordingly, the first voltage V1, which is a high voltage, may be applied to the first gate pattern 420a through the metal layer ML and the first capacitor electrode 430. Meanwhile, the second voltage V2 may be applied to the first and second active patterns 410a and 410b through the metal layer ML, and the second and third capacitor electrodes 440 and 450. In an embodiment, a voltage level of the second voltage V2 may be sufficiently lower than a voltage level of the first voltage V1.

Meanwhile, the low-voltage transistor 600 may include a substrate SUB, first and second active patterns 610a and 610b, a gate pattern 620, first to third metal contacts 630, 640, and 650, and a metal layer ML. Herein, the first and second active patterns 610a and 610b may be defined in a well 605 in the substrate SUB. A low voltage V_L may be applied to the gate pattern 620 through the metal layer ML and the first metal contact 630. Herein, a voltage level of the low voltage V_L may be a power supply voltage VCC or less than the VCC. Accordingly, a length in the vertical direction VD between the gate pattern 620 and a channel region CH", that is, the second thickness TH2 of the gate insulating film (120 in FIG. 1) may be smaller than the first thickness TH1 of the gate insulating film in the vertical capacitor structure 400.

In addition, a source voltage V_S may be applied to the first active pattern 610a through the second metal contact 640, and a drain voltage V_D may be applied to the second active pattern 610b through the third metal contact 650. Herein, the source voltage V_S and the drain voltage V_D may be different from each other and a current may flow in the channel region CH". Therefore, a channel capacitor may not be formed between the gate pattern 620 and the channel region CH".

In an embodiment, a voltage level of the second voltage V2 may be lower than a voltage level of the first voltage V1. For example, the voltage level of the second voltage V2 may be similar to a voltage level of the source voltage V_S or the drain voltage V_D of the low-voltage transistor 600. By doing so, a junction breakdown between the first and second active patterns 410a and 410b and the substrate SUB and/or a breakdown between the first active pattern 410a and the second active pattern 410b may be prevented.

Although not shown, a gate length of the first gate pattern 420a of the vertical capacitor structure 400 may be the same as or similar to a gate length of the gate pattern 620 of the low-voltage transistor 600, in the first horizontal direction HD1. In this case, the gate length of the gate pattern 620 may be the minimum length used for a low-voltage transistor in the memory device (e.g., the critical feature size of the memory device).

Figure 12:
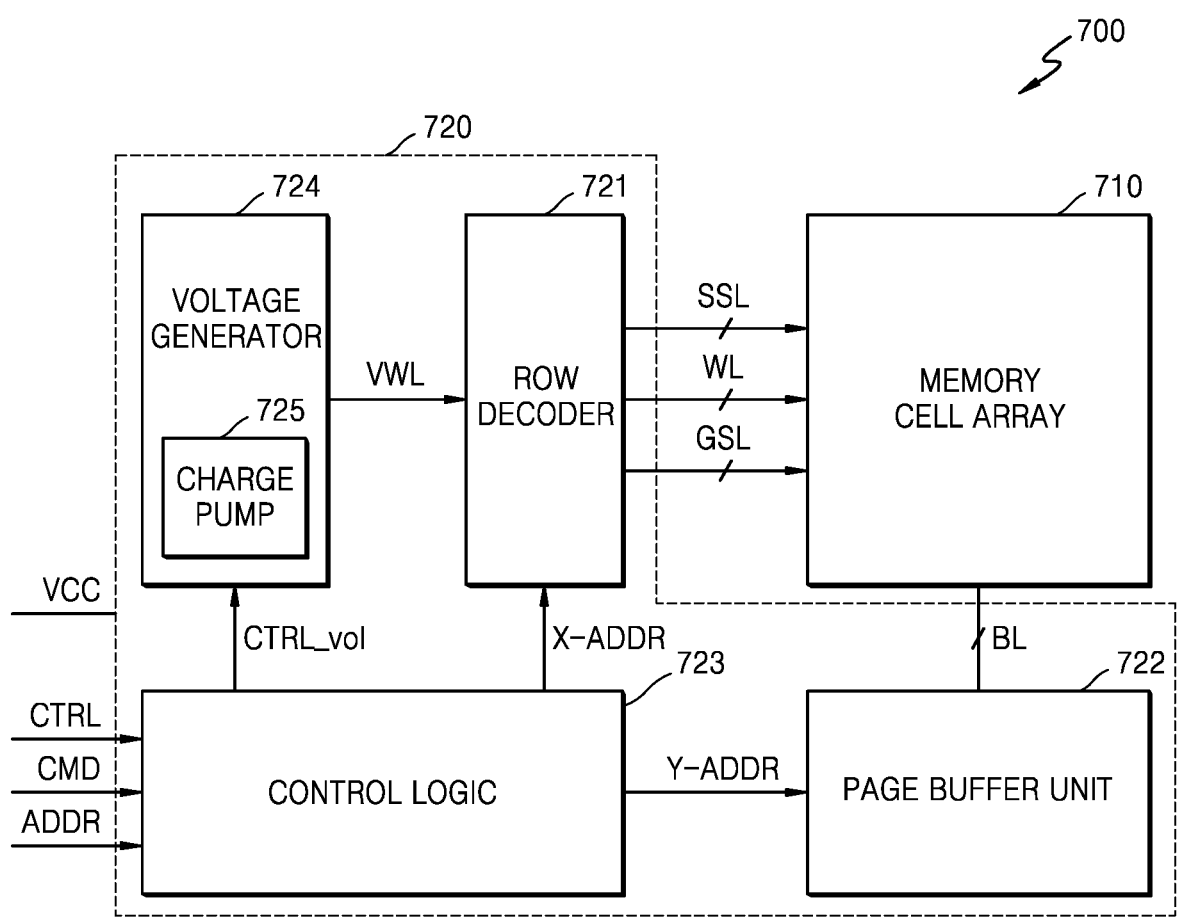
FIG. 12 is a block diagram of a non-volatile memory device according to an embodiment of the inventive concept.

FIG. 12 is a block diagram of a non-volatile memory device 700 according to an embodiment.

Referring to FIG. 12, the non-volatile memory device 700 may include a memory cell array 710 and a peripheral circuit 720, wherein the peripheral circuit 720 may include a row decoder 721, a page buffer unit 722, a control logic 723, and a voltage generator 724. Although not illustrated in FIG. 12, the peripheral circuit 720 may further include a data input/output circuit or an input/output interface, or the like. In addition, the peripheral circuit 720 may further include a column logic, a pre-decoder, a temperature sensor, a command decoder, an address decoder, or the like. A power supply voltage VCC may be applied to the non-volatile memory device 700. The peripheral circuit 720 may be applied a voltage such as the power supply voltage VCC, a low voltage and a high voltage. A voltage level of the low voltage may be equal to or less than a power supply voltage VCC and a voltage level of the high voltage may be greater than the power supply voltage VCC.

The memory cell array 710 may be connected to the page buffer unit 722 through bit lines BL, and may be connected to the row decoder 721 through word lines WL, a string selection line SSL, and a ground selection line GSL. The memory cell array 710 may include a plurality of memory cells. For example, the plurality of memory cells may be flash memory cells. Hereinafter, a case where the plurality of memory cells are NAND flash memory cells will now be used as an example to describe the embodiments of the inventive concept in detail. However, the inventive concept is not limited thereto. In some embodiments, the plurality of memory cells may be resistive memory cells such as resistive RAM (ReRAM), phase change RAM (PRAM), or magnetic RAM (MRAM).

In an embodiment, the memory cell array 710 may include a three-dimensional memory cell array, wherein the three-dimensional memory cell array may include a plurality of NAND strings, and each NAND string may include memory cells respectively connected to word lines vertically stacked on a substrate. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and 2011/0233648.

The control logic 723 may program data to the memory cell array 710 and read data from the memory cell array 710 based on a command CMD, an address ADDR, and a control signal CTRL, or may output various control signals such as voltage control signal CTRL_vol, row address X-ADDR, and column address Y-ADDR to erase data stored in the memory cell array 710. Hereby, the control logic 723 may generally control various operations in the non-volatile memory device 700.

The peripheral circuit 720 may include a plurality of high-voltage transistors 500 and a plurality of low-voltage transistors 600. For example, the voltage generator 724 may include a plurality of high-voltage transistors 500 and a plurality of low-voltage transistors 600.

The voltage generator 724 may generate various types of voltages to perform programming, reading, and erasing operations on the memory cell array 710 based on the voltage control signal CTRL_vol. In detail, the voltage generator 724 may generate a word line voltage (VWL), for example, a program voltage, a read voltage, a pass voltage, an erase verifying voltage or program verifying voltage, or the like. In addition, the voltage generator 724 may further generate a string selection line voltage and a ground selection line voltage based on the voltage control signal CTRL_vol.

In an embodiment, the voltage generator may include a charge pump 725. The charge pump 725 may perform a positive charge pump operation or a negative charge pump operation based on the voltage control signal CTRL_vol. The charge pump 725 may, for example, generate a program voltage or an erase voltage according to a charge pump operation. In the present embodiment, the charge pump 725 may include a vertical capacitor structure. For example, the charge pump 725 may include the vertical capacitor structure 100 shown in FIGS. 1 to 3, the vertical capacitor structure 200 shown in FIG. 4, the vertical capacitor structure shown in FIGS. 5 and 6, and the vertical capacitor structure 400 shown in FIGS. 8 to 11.

In detail, the charge pump 725 may include a vertical capacitor structure which includes a gate pattern, a gate insulating film between the gate pattern and the substrate, active patterns in a substrate, and a plurality of capacitor electrodes located on the gate patterns and the active patterns and extending in a vertical direction. Herein, a first voltage may be applied to the gate pattern and a second voltage different from the first voltage may be applied to the active patterns. In an embodiment, the charge pump 725 may be connected to the gate pattern of the vertical capacitor structure and a clock buffer (not shown) in the peripheral circuit 720 may be connected to the first and second active patterns of the vertical capacitor structure. For example, a clock signal CLK or an inverted clock signal CLKB output from the clock buffer may be connected to the first and second active patterns of the vertical capacitor structure. A voltage applied to the gate pattern may be a higher voltage greater than a power supply voltage VCC (e.g., a voltage greater than 3V). Accordingly, a thickness of the gate insulating film between the gate pattern and the substrate in the vertical capacitor structure according to the present embodiment may be greater than a thickness of a gate insulating film between a gate pattern and the substrate of the low-voltage transistor. In addition, the vertical capacitor structure according to the present embodiment may have a space between the first and second active patterns that may be equal to or less than a length of the gate pattern. Since a turn-on current may not flow in a channel region between the active patterns and a charge may not exist in a trapped state, the vertical capacitor structure may obtain a channel capacitance between the gate pattern and the channel region. In addition, since the first voltage and the second voltage, which are different voltages are applied between the plurality of capacitor electrodes which are adjacent to each other, the vertical capacitor structure may obtain a vertical capacitance between the plurality of capacitor electrodes.

Therefore, an integration degree of a capacitor of the charge pump 725 may be increased to increase a capacitance per unit area. Accordingly, since a capacity of the charge pump 725 may be increased while reducing an area of the charge pump 725, a space efficiency of the charge pump 725 may be improved. In addition, an area of the non-volatile memory device 700, that is, a chip size may be reduced by reducing the area of the charge pump 725.

The row decoder 721 may, in response to the row address X-ADDR, select one of the plurality of memory blocks, select one of the word lines WL of the selected memory block, and select one of the plurality of string selection lines SSL. The page buffer unit 722 may select some of the bit lines BL in response to the column address Y-ADDR. In detail, the page buffer unit 722 operates as a write driver or a sense amplifier according to an operation mode.

Figure 13:
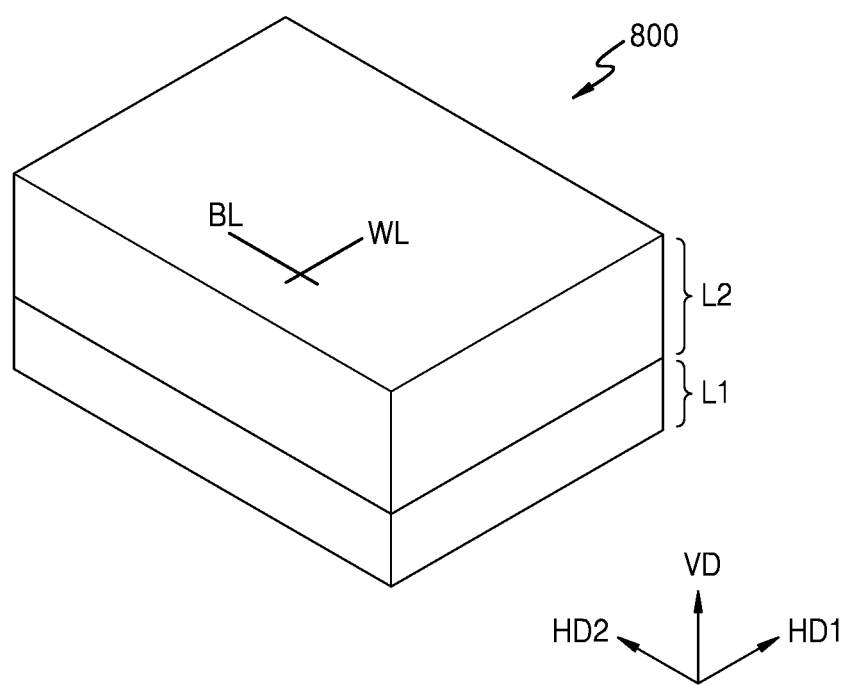
FIG. 13 is a schematic view illustrating a non-volatile memory device according to an embodiment of the inventive concept.

FIG. 13 is a view schematically illustrating a non-volatile memory device 800 according to an embodiment.

Referring to FIG. 13, the non-volatile memory device 800 may include a first semiconductor layer L1 and a second semiconductor layer L2, wherein the second semiconductor layer L2 may be stacked on the first semiconductor layer L1 in a vertical direction VD. In detail, the first semiconductor layer L1 may be located at a lower portion of the second semiconductor layer L2 in the vertical direction VD. Accordingly, the first semiconductor layer L1 may be located close to a substrate.

In an embodiment, the memory cell array 710 of FIG. 12 may be formed in the second semiconductor layer L2 and the peripheral circuit 720 of FIG. 12 may be formed in the first semiconductor layer L1. Accordingly, the non-volatile memory device 800 may have a structure in which the memory cell array 710 is above the peripheral circuit 720, that is, a cell over periphery (COP) structure. The COP structure may effectively reduce an area in the vertical direction VD and a degree of integration of the non-volatile memory device 800 may be increased.

In an embodiment, the first semiconductor layer L1 may include a substrate and form a pattern for wiring semiconductor elements like transistors and elements on the substrate to form circuits including the peripheral circuit 720 in the first semiconductor layer L1. After the circuits are formed in the first semiconductor layer L1, a second semiconductor layer L2 including the memory cell array 710 may be formed and patterns for electrically connecting the word lines WL and the bit lines BL of the memory cell array 710 with the circuits formed in the first semiconductor layer L1 may be formed.

Figure 14:
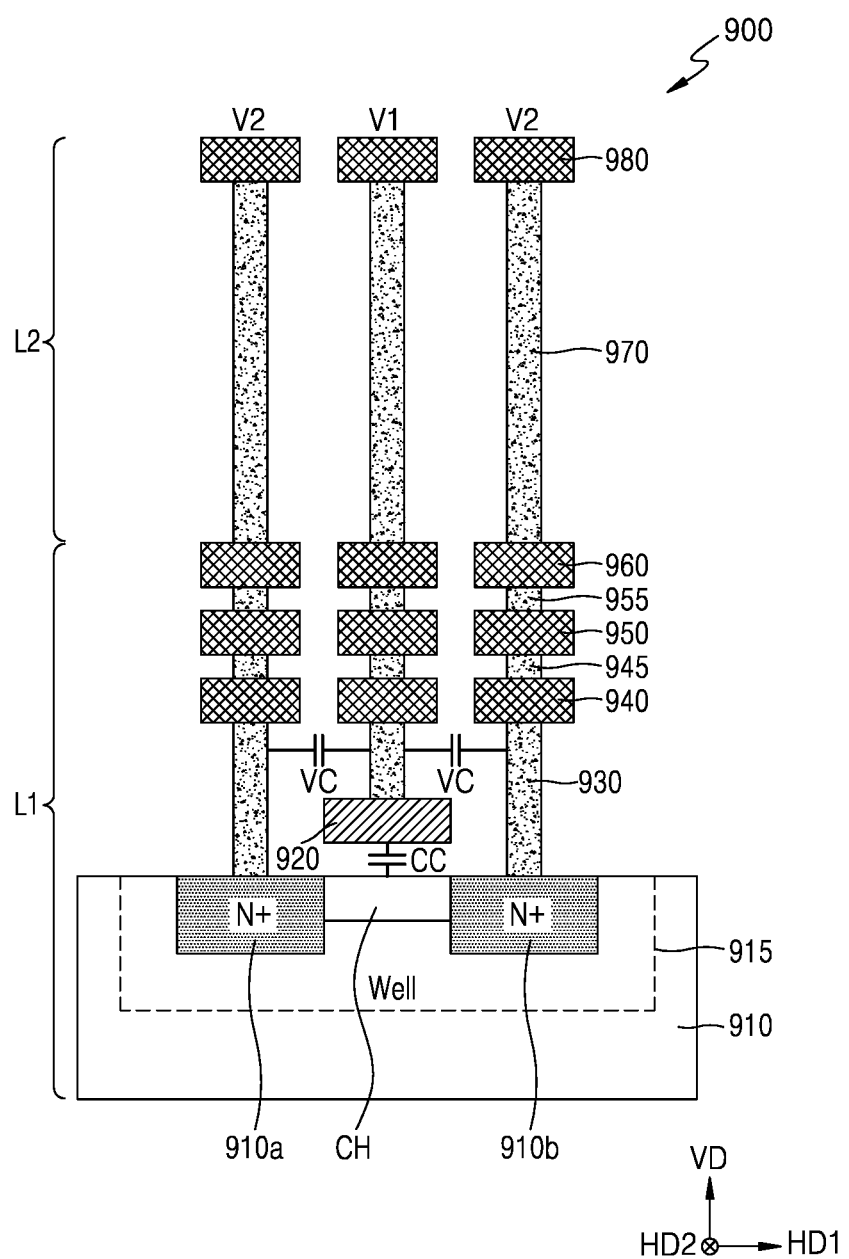
FIG. 14 is a cross-sectional view of a non-volatile memory device according to an embodiment of the inventive concept.

FIG. 14 is a cross-sectional view of a non-volatile memory device 900 according to an embodiment.

Referring to FIG. 14, the non-volatile memory device 900 may correspond to one implementation of the non-volatile memory device 800 of FIG. 13. The non-volatile memory device 900 may include the first and second semiconductor layers L1 and L2, wherein a vertical capacitor structure may be formed in the first semiconductor layer L1 and a memory cell array may be formed in the second semiconductor layer L2.

The vertical capacitor structure formed in the first semiconductor layer L1 may be the same as the vertical capacitor structure 100 illustrated in FIGS. 1 to 3, the vertical capacitor structure 200 illustrated in FIG. 4, the vertical capacitor structure illustrated in FIGS. 5 and 6, and the vertical capacitor structure 400 illustrated in FIGS. 8 to 11. Accordingly, the above-mentioned descriptions may be applied to the present embodiment and redundant description will be omitted.

In detail, the first semiconductor layer L1 may include a substrate 910, first and second active patterns 910A and 910V, a gate pattern 920, capacitor electrodes 930, first to third metal layers 940, 950, and 960. First studs 945 may be located between the first metal layer 940 and the second metal layer 950, and second studs 955 may be located between the second metal layer 950 and the third metal layer 960. However, the inventive concept is not limited thereto. A number of metal layers may be variously changed according to the embodiment. The semiconductor layer L2 may include metal contacts 970 and a fourth metal layer 980. For example, the metal contacts 970 may be implemented as a through silicon via (TSV).

In the present embodiment, a first voltage V1 may be applied to the gate pattern 920 and a second voltage V2 may be applied to the first and second active patterns 910a and 910b through the metal contacts 970, that is, the TSV. Accordingly, a turn-on current may not flow in channel region CH between the first and second active patterns 910a and 910b, and the gate pattern 920 and the channel region CH may form a channel capacitor CC. In addition, the capacitor electrodes 930 which are adjacent to each other may form a vertical capacitor VC.

Figure 15:
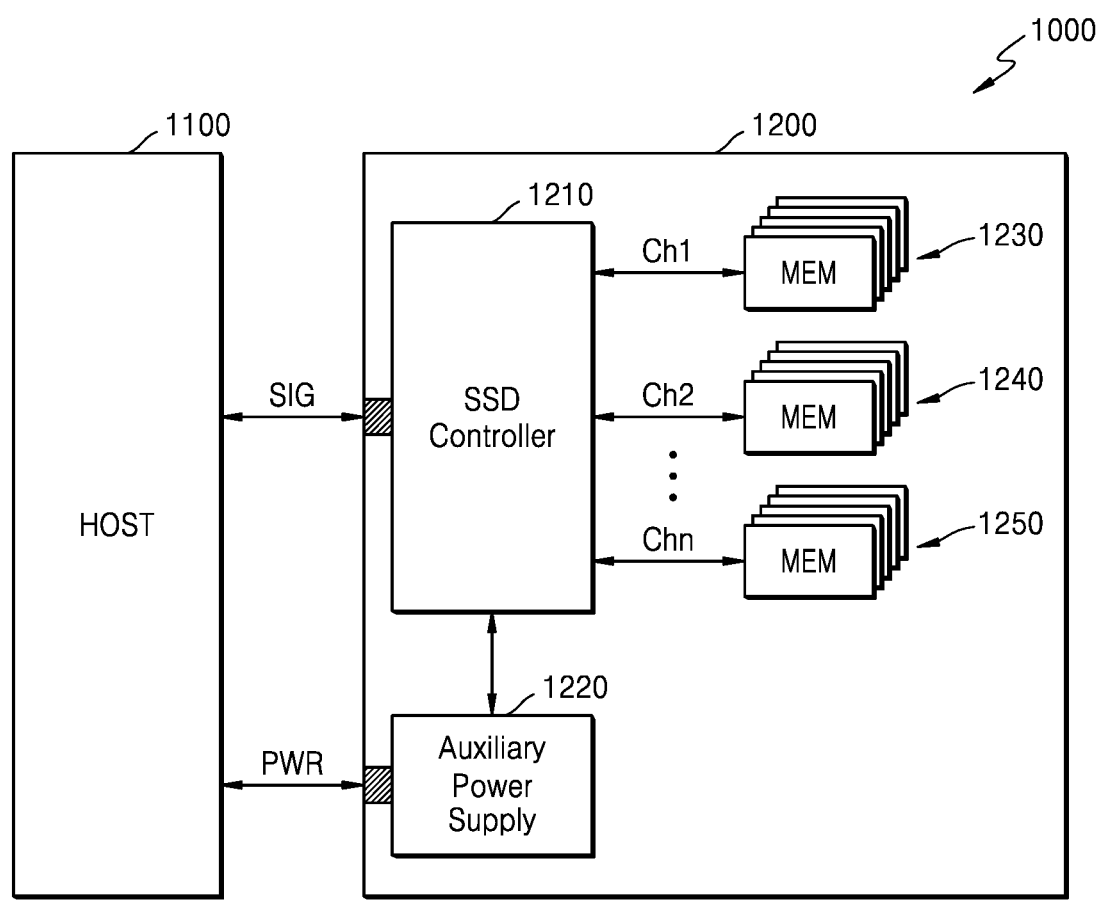
FIG. 15 is a block diagram illustrating an embodiment of applying a memory device according to some embodiments to a solid state drive (SSD) system.

FIG. 15 is a block diagram illustrating an embodiment of applying a memory device according to some embodiments of to a solid-state drive (SSD) system 1000.

Referring to FIG. 15, the SSD system 1000 may include a host 1100 and an SSD 1200. The SSD 1200 exchanges signals with the host through a signal connector and receives power through a power connector. The SSD 1200 may include an SSD controller 1210, an auxiliary power supply 1220, and memory devices 1230, 1240, and 1250. The memory devices 1230, 1240, and 1250 may be vertical stacked NAND flash memory devices. Herein, the memory devices 1230, 1240, and 1250 may be implemented by using the above-mentioned embodiments with reference to FIGS. 1 to 14.

According to the inventive concept, a vertical capacitor structure may use a gate pattern and active patterns as a lower portion structure, use capacitor electrodes located on the gate pattern and the active patterns as an upper portion structure, and apply a same voltage to the active patterns. Accordingly, a vertical capacitance between the capacitor electrodes and a channel capacitance between a channel region, which is between the active patterns, and the gate pattern may be obtained. Therefore, an integration degree of a capacitor may be improved and a capacitance per unit area may be increased.

In addition, according to the inventive concept, a charge pump included in a peripheral circuit area of a non-volatile memory device may have a vertical capacitor structure. Accordingly, since a capacity of the charge pump may be increased while reducing an area of the charge pump, a space efficiency of the charge pump may be improved. In addition, an area of the non-volatile memory device, that is, a chip size may be reduced by reducing an area of the charge pump.

As described above, example embodiments have been disclosed in the drawings and the inventive concept. Although specific language has been used to describe the embodiments in the inventive concept, the specific language is used for the purpose of describing the spirit of the inventive concept and no limitation of the scope of the inventive concept as defined by the following claims is intended by this specific language. While the inventive concept has been particularly shown and described with reference to embodiments thereof, it will be understood that various changes in form and details may be made therein without departing from the spirit and scope of the following claims.

What is claimed is:

1. A non-volatile memory device comprising:
a substrate including a memory cell area and a peripheral circuit area;
a memory cell string including a vertical channel structure and a plurality of memory cells located in the memory cell area;
a voltage generator located in the peripheral circuit area, the voltage generator including a first transistor and configured to provide various voltages to the plurality of memory cells;
an interlayer insulating film in the peripheral circuit area; and
a vertical capacitor structure located in the peripheral circuit area,
wherein the vertical capacitor structure comprises:
a first active pattern and a second active pattern arranged apart from each other in a first horizontal direction;
a first gate pattern located above a channel region between the first active pattern and the second active pattern;
a first gate insulating film between the first gate pattern and the substrate in a vertical direction with respect to the substrate; and
a plurality of capacitor electrodes each extending in the vertical direction,
wherein the plurality of capacitor electrodes comprise:
a first capacitor electrode in contact with the first gate pattern, to which a first voltage is applied, and forming a channel capacitor with the channel region;
a second capacitor electrode in contact with the first active pattern and to which a second voltage is applied, the second voltage being different from the first voltage; and
a third capacitor electrode in contact with the second active pattern and to which the second voltage is applied,
wherein the first transistor includes a second gate pattern and a second gate insulating film between the second gate pattern and the substrate in the vertical direction,
wherein the first gate insulating film has a thickness greater than a thickness of the second gate insulating film in the vertical direction,
wherein the plurality of capacitor electrodes penetrate the interlayer insulating film in the vertical direction,
wherein the first capacitor electrode, the interlayer insulating film, and the second capacitor electrode form a first vertical capacitor, and
wherein the first capacitor electrode, the interlayer insulating film, and the third capacitor electrode form a second vertical capacitor.

2. The non-volatile memory device of claim 1, wherein the voltage generator further includes:
a second transistor including a third gate pattern and a third gate insulating film between the third gate pattern and the substrate in the vertical direction,
wherein the non-volatile memory device is configured such that a high voltage greater than a power supply voltage is applied to the second transistor, and
wherein the third gate insulating film has a thickness that is the same as a thickness of the first gate insulating film in the vertical direction.

3. The non-volatile memory device of claim 2, wherein the first gate pattern has a length less than a length of the third gate pattern in the first horizontal direction.

4. The non-volatile memory device of claim 2, wherein the vertical capacitor structure further comprises a lightly doped drain region located in an edge of each of the first and second active patterns between the first active pattern and the second active pattern,
wherein the second transistor includes third and fourth active patterns in the substrate and a lightly doped drain region located in an edge of each of the third and fourth active patterns between the third active pattern and the fourth active pattern, and
wherein each lightly doped drain region of the vertical capacitor structure has a length in the first horizontal direction less than a length of each lightly doped drain region of the second transistor in the first horizontal direction.

5. The non-volatile memory device of claim 1, wherein the non-volatile memory device is configured such that no turn-on current flows in the channel region.

6. The non-volatile memory device of claim 1, wherein the first and second active patterns and the first gate pattern extend in a second horizontal direction different from the first horizontal direction, and
wherein the non-volatile memory device is configured such that different voltages are respectively applied to adjacent capacitor electrodes in the first horizontal direction among the plurality of capacitor electrodes.

7. The non-volatile memory device of claim 1, wherein the first and second active patterns and the first gate pattern extend in a second horizontal direction different from the first horizontal direction, and
wherein a distance between the first and second active patterns in the first horizontal direction is less than a length of the first gate pattern in the first horizontal direction.

8. The non-volatile memory device of claim 1, wherein the first and second active patterns and the first gate pattern extend in a second horizontal direction different from the first horizontal direction,
wherein the plurality of capacitor electrodes further comprise:
a plurality of additional first capacitor electrodes in contact with the first gate pattern and apart from each other in the second horizontal direction;
a plurality of additional second capacitor electrodes in contact with the first active pattern and apart from each other in the second horizontal direction; and
a plurality of additional third capacitor electrodes in contact with the second active pattern and apart from each other in the second horizontal direction, and
wherein the number of first, second and third capacitor electrodes are equal to each other.

9. The non-volatile memory device of claim 1, wherein the plurality of capacitor electrodes further comprise a fourth capacitor electrode in contact with the first active pattern and apart from the second capacitor electrode in a second horizontal direction different from the first horizontal direction, and
wherein the first capacitor electrode and the fourth capacitor electrode form a third vertical capacitor.

10. The non-volatile memory device of claim 9, wherein the plurality of capacitor electrodes further comprise a fifth capacitor electrode in contact with the second active pattern and apart from the third capacitor electrode in the second horizontal direction, and wherein the first capacitor electrode and the fifth capacitor electrode form a fourth vertical capacitor.

11. The non-volatile memory device of claim 10, wherein the first gate pattern extends in the second horizontal direction,
wherein the plurality of capacitor electrodes further comprise a sixth capacitor electrode in contact with the first gate pattern and apart from the first capacitor electrode in the second horizontal direction, and
wherein the fifth capacitor electrode and the sixth capacitor electrode form a fifth vertical capacitor.

12. The non-volatile memory device of claim 1, wherein a voltage level of the second voltage is lower than a voltage level of the first voltage.

13. A non-volatile memory device comprising:
a first semiconductor layer;
a second semiconductor layer above the first semiconductor layer in a vertical direction and including a memory cell array having a plurality of memory cells stacked each other; and
a plurality of metal contacts penetrating the second semiconductor layer in the vertical direction,
wherein the first semiconductor layer comprises:
a substrate;
a first active pattern and a second active pattern arranged apart from each other in the substrate in a first horizontal direction;
a first gate pattern located above a channel region between the first active pattern and the second active pattern; and
a plurality of capacitor electrodes each extending in the vertical direction and respectively connected to the plurality of metal contacts, and
wherein the plurality of capacitor electrodes comprise:
a first capacitor electrode in contact with the first gate pattern, to which a first voltage is applied, and forming a channel capacitor with the channel region;
a second capacitor electrode in contact with the first active pattern and to which a second voltage is applied, the second voltage being different from the first voltage; and
a third capacitor electrode in contact with the second active pattern and to which the second voltage is applied.

14. The non-volatile memory device of claim 13, wherein the first semiconductor layer further comprises:
a first gate insulating film between the first gate pattern and the channel region; and
a voltage generator including a low-voltage transistor and configured to provide various voltages to the plurality of memory cells,
wherein the low-voltage transistor includes a second gate pattern and a second gate insulating film between the second gate pattern and the substrate in the vertical direction,
wherein the first gate insulating film has a thickness greater than a thickness of the second gate insulating film in the vertical direction, and
wherein the first gate pattern, the first gate insulating film, and the channel region form a channel capacitor.

15. The non-volatile memory device of claim 13, wherein the first semiconductor layer further comprises:
a lightly doped drain region located in an edge of each of the first and second active patterns between the first active pattern and the second active pattern; and a voltage generator including a high-voltage transistor and configured to provide various voltages to the plurality of memory cells,
wherein the high-voltage transistor includes third and fourth active patterns spaced apart from each other in the substrate in the first horizontal direction and a lightly doped drain region located in an edge of each of the third and fourth active patterns between the third active pattern and the fourth active pattern, and
wherein each lightly doped drain region between the first active pattern and the second active pattern has a length in the first horizontal direction less than a length of each lightly doped drain region of the high-voltage transistor in the first horizontal direction.

16. The non-volatile memory device of claim 13, wherein the first semiconductor layer further comprises an interlayer insulating film located above the first and second active patterns and the first gate pattern,
wherein the plurality of capacitor electrodes penetrate the interlayer insulating film in the vertical direction,
wherein the first capacitor electrode, the interlayer insulating film, and the second capacitor electrode form a first vertical capacitor, and
wherein the first capacitor electrode, the interlayer insulating film, and the third capacitor electrode form a second vertical capacitor.

17. The non-volatile memory device of claim 13, wherein the first and second active patterns and the first gate pattern extend in a second horizontal direction different from the first horizontal direction, and
wherein the non-volatile memory device is configured such that different voltages are respectively applied to adjacent capacitor electrodes in the first horizontal direction among the plurality of capacitor electrodes.

18. A non-volatile memory device comprising:
a substrate;
a plurality of memory cells stacked each other on the substrate;
a voltage generator including a low-voltage transistor and a high-voltage transistor on the substrate and configured to provide various voltages to the plurality of memory cells; and
a vertical capacitor structure, wherein the vertical capacitor structure comprises:
a first active pattern and a second active pattern arranged apart from each other in the substrate in a first horizontal direction;
a first gate pattern located above the substrate between the first active pattern and the second active pattern;
a first gate insulating film between the first gate pattern and the substrate in a vertical direction with respect to the substrate; and
a plurality of capacitor electrodes each extending in the vertical direction, wherein the plurality of capacitor electrodes comprise:
a first capacitor electrode in contact with the first gate pattern, to which a first voltage is applied, and forming a channel capacitor with the substrate;
a second capacitor electrode in contact with the first active pattern, to which a second voltage is applied, the second voltage being different from the first voltage, and forming a first vertical capacitor with the first capacitor electrode; and
a third capacitor electrode in contact with the second active pattern, to which the second voltage is applied, and forming a second vertical capacitor with the first capacitor electrode, wherein the low-voltage transistor includes a second gate pattern and a second gate insulating film between the second gate pattern and the substrate in the vertical direction, wherein the high-voltage transistor includes a third gate pattern and a third gate insulating film between the third gate pattern and the substrate in the vertical direction, and wherein the first gate insulating film has a thickness equal to a thickness of the third gate insulating film in the vertical direction.

\* \* \* \* \*